United States Patent
Lombard et al.

(10) Patent No.: US 11,664,040 B2
(45) Date of Patent: *May 30, 2023

(54) APPARATUS AND METHOD FOR REDUCING NOISE IN AN AUDIO SIGNAL

(71) Applicant: Fraunhofer-Gesellschaft zur Foerderung der angewandten Forschung e.V., Munich (DE)

(72) Inventors: Anthony Lombard, Erlangen (DE); Bernhard Birzer, Erlangen (DE); Dirk Mahne, Erlangen (DE); Edwin Mabande, Erlangen (DE); Fabian Kuech, Erlangen (DE); Emanuel Habets, Erlangen (DE); Paolo Annibale, Erlangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 60 days.

This patent is subject to a terminal disclaimer.

(21) Appl. No.: 17/210,415

(22) Filed: Mar. 23, 2021

(65) Prior Publication Data

US 2021/0233551 A1 Jul. 29, 2021

Related U.S. Application Data

(63) Continuation of application No. 16/381,770, filed on Apr. 11, 2019, now Pat. No. 11,056,128, which is a (Continued)

(30) Foreign Application Priority Data

Oct. 18, 2016 (EP) ..................................... 16194467

(51) Int. Cl.
*G10L 21/0216* (2013.01)
*G10L 21/0324* (2013.01)
(Continued)

(52) U.S. Cl.
CPC ...... *G10L 21/0216* (2013.01); *G10L 21/0208* (2013.01); *G10L 21/0316* (2013.01);
(Continued)

(58) Field of Classification Search
CPC .................................................. G10L 21/0216
See application file for complete search history.

(56) References Cited

U.S. PATENT DOCUMENTS 7,454,010 B1 11/2008 Ebenezer
9,049,503 B2 6/2015 Yiu
(Continued)

FOREIGN PATENT DOCUMENTS

CN 1155139 C 6/2004
CN 101080766 A 11/2007
(Continued)

OTHER PUBLICATIONS

David Malah, et al., "Speech Enhancement Using a Minimum Mean-Square Error Log-Spectral Amplitude Estimator", IEEE Trans. Acoust. Speech Signal Processing, vol. ASSP-33. No. 2, pp. 1109-1121, Apr. 1985.
(Continued)

*Primary Examiner* — Shaun Roberts
(74) *Attorney, Agent, or Firm* — Perkins Coie LLP; Michael A. Glenn

(57) ABSTRACT

An apparatus for processing an audio signal includes an audio signal analyzer and a filter. The audio signal analyzer is configured to analyze an audio signal to determine a plurality of noise suppression filter values for a plurality of bands of the audio signal, wherein the analyzer is configured to determine a noise suppression filter value so that a noise suppression filter value is greater than or equal to a minimum noise suppression filter value and so that the minimum noise suppression value depends on a characteristic of the
(Continued)

audio signal. The filter is configured for filtering the audio signal, wherein the filter is adjusted based on the noise suppression filter values.

15 Claims, 15 Drawing Sheets

Related U.S. Application Data continuation of application No. PCT/EP2017/076483, filed on Oct. 17, 2017.

(51) Int. Cl.
  *H03G 3/00* (2006.01)
  *H03G 7/00* (2006.01)
  *G10L 21/0208* (2013.01)
  *G10L 21/0316* (2013.01)

(52) U.S. Cl.
  CPC ......... *G10L 21/0324* (2013.01); *H03G 3/002* (2013.01); *H03G 7/007* (2013.01); *G10L 2021/02161* (2013.01)

(56) References Cited

U.S. PATENT DOCUMENTS

| | | |
|---|---|---|
| 2007/0023721 A1 | 2/2007 | Lomicka et al. |
| 2007/0237271 A1 | 10/2007 | Pessoa et al. |
| 2008/0147387 A1 | 6/2008 | Matsubara et al. |
| 2008/0269926 A1 | 10/2008 | Xiang et al. |
| 2009/0292536 A1 | 11/2009 | Hetherington et al. |
| 2010/0104113 A1 | 4/2010 | Liu |
| 2010/0211388 A1 | 8/2010 | Yu et al. |
| 2011/0044461 A1 | 2/2011 | Kuech et al. |
| 2013/0325458 A1 | 12/2013 | Buck et al. |
| 2015/0222988 A1 | 8/2015 | Sorensen et al. |
| 2015/0348568 A1 | 12/2015 | Li et al. |
| 2016/0005422 A1 | 1/2016 | Issa et al. |
| 2016/0064009 A1 | 3/2016 | Every et al. |

FOREIGN PATENT DOCUMENTS

| | | |
|---|---|---|
| CN | 101727911 A | 6/2010 |
| CN | 101727912 A | 6/2010 |
| CN | 103299656 A | 9/2013 |
| CN | 105940449 A | 9/2016 |
| JP | H07235848 A | 9/1995 |
| JP | 2002204493 A | 7/2002 |
| JP | 2004015125 A | 1/2004 |
| JP | 2005184154 A | 7/2005 |
| JP | 2009104140 A | 5/2009 |
| JP | 2013525843 A | 6/2013 |
| JP | 2014502471 A | 1/2014 |
| JP | 6252783 B2 | 12/2017 |
| RU | 2469423 C2 | 12/2012 |
| RU | 2495506 C2 | 10/2013 |
| WO | 2009017392 A1 | 2/2009 |

OTHER PUBLICATIONS

Favrot, Alexis, et al., "Acoustic Echo Control Based on Temporal Fluctuations of Short-Time Spectra", in Proc. International Workshop on Acoustic Echo and Noise Control (IWAENC).

Hänsler, Eberhard, et al., "Hands-free telephones—Joint Control of Echo Cancellation and Postfiltering", Signal Processing, vol. 80, Issue: 11, pp. 2295-2305, Sep. 2000, pp. 2295-2305.

Küech, Fabian, et al., "State-space architecture of the partitioned-block-based acoustic echo controller", in Proc. IEEE International Conference on Acoustics, Speech and Signal Processing (ICASSP), May 2014.

Miyazaki, Ryoichi, et al., "Sound quality evaluation in various musical noise-free speech enhancement methods", Proceedings of the 2013 Acoustical Society of Japan Autumn Meeting, CD-ROM, Sep. 17, 2013, pp. 619-622; English translation not available.

Shi, Guangji, et al., "Subband Comfort Noise Insertion for an Acoustic Echo Suppressor", in Proc. 133rd Audio Engineering Society Convention, Oct. 2012.

APPARATUS AND METHOD FOR REDUCING NOISE IN AN AUDIO SIGNAL

CROSS-REFERENCES TO RELATED APPLICATIONS

This application is a continuation of copending U.S. patent application Ser. No. 16/381,770, filed Apr. 11, 2019, which is a continuation of copending International Application No. PCT/EP2017/076483, filed Oct. 17, 2017, which is incorporated herein by reference in its entirety, and additionally claims priority from European Application No. EP 16194467.3, filed Oct. 18, 2016, which is incorporated herein by reference in its entirety.

The present invention generally relates to audio signal processing. Specifically, the present invention relates to a technique and a method of automatic control of speech and noise levels in an audio signal.

BACKGROUND OF THE INVENTION

A full-duplex speech communication scenario is illustrated in FIG. 13, where the voice of a near-end speaker is captured by one or several microphones and transmitted to a far-end speaker listening to the captured sound via loudspeakers or headphones. To improve both listening comfort and intelligibility for the far-end listener, some audio signal processing techniques can be applied to remove or at least attenuate undesired sound components, including acoustical echoes or background and sensor noise, while preserving the near-end speaker's voice. Another important aspect to improve listening comfort and intelligibility is to adjust the level of the enhanced signal to a comfortable level for the far-end listener. This can provide a consistent speech level regardless of the sensitivity of the sound capture device and regardless of the distance from the near-end speaker to the microphone.

In such a full-duplex speech communication scenario sporadic echoes should be completely removed using acoustic echo cancellation, acoustic echo suppression, or a combination of both techniques, for example as described in [1, 2, 3]. In contrast, more persistent disturbances like background or sensor noise can usually only be attenuated up to a certain amount to preserve the speech quality using some noise reduction methods, for example as described in [4]. Hence, for demanding (i.e. complex or adverse) acoustic environments, the resulting signal can contain some attenuated but still audible noise components. The goal of an automatic gain control is to bring the level of the enhanced speech signal to a predefined and comfortable level. A typical audio signal processing chain is depicted in FIG. 14, including some echo control based either on acoustic echo cancellation or acoustic echo suppression, a noise reduction module, and an automatic gain control module. A comfort noise module at the end of the processing chain generates some artificial random noise to ensure a pleasant and temporally smooth noise level at the system output. Comfort noise injection is triggered for example by the echo control during periods of far-end activity, for example as described in [5].

Furthermore, in speech communication, noise reduction aims at attenuating some stationary or slowly time-varying background or sensor noise present in an audio signal while preserving the desired speech signal. This is for example carried out in the frequency domain on a frame-by-frame basis. For instance, for each time frame, spectral regions exhibiting a low Signal-to-Noise Ratio (SNR) are attenuated whereas high-SNR regions are kept unchanged. Furthermore, a more general Signal-to-interference (SIR) ratio can be considered for treating spectral regions, as described above.

In [6] a first NR(=Noise Reduction) filter is computed independently from an AGC (=Automatic Gain Control) gain. A second NR filter is then computed by scaling the first NR filter as a function of the AGC gain, i.e. for large AGC gains, the NR gain is decreased (strong noise attenuation) while for small AGC gains the NR gain is increased (less noise reduction). The second filter is applied to the input signal. In contrast, an aspect of the present invention is to derive a filter performing NR and AGC simultaneously. This provides full control over the speech and noise levels separately.

In such systems, a problem exists in that particularly the minimum noise suppression filter values are fixedly set resulting in a reduced audio quality of the processed audio signal.

With respect to the described problems of processing an audio signal, a desire exists for an improved concept, providing an improved audio quality of the processed audio signal.

SUMMARY

According to an embodiment, an apparatus for processing an audio signal may have: an audio signal analyzer for analyzing an audio signal to determine a plurality of noise suppression filter values for a plurality of bands of the audio signal, wherein the analyzer is configured to determine the noise suppression filter values so that a noise suppression filter value is greater than or equal to a minimum noise suppression filter value, and so that the minimum noise suppression filter value depends on a characteristic of the audio signal; and a filter for filtering the audio signal, wherein the filter is adjusted based on the noise suppression filter values.

According to another embodiment, a method for processing an audio signal may have the steps of: analyzing an audio signal to determine a plurality of noise suppression filter values for a plurality of bands of the audio signal, determining the noise suppression filter values so that a noise suppression filter value is greater than or equal to a minimum noise suppression filter value, and so that the minimum noise suppression filter value depends on a characteristic of the audio signal; and filtering the audio signal based on the noise suppression filter values.

According to another embodiment, a non-transitory digital storage medium may have a computer program stored thereon to perform the inventive method, when said computer program is run by a computer.

An advantageous embodiment according to the invention creates an apparatus for processing an audio signal, comprising an audio signal analyzer for analyzing an audio signal to determine a plurality of noise suppression filter values for a plurality of bands of the audio signal, wherein the analyzer is configured to determine the noise suppression filter values so that a noise suppression filter value is greater than or equal to a minimum noise suppression filter value. Furthermore, the audio signal analyzer is configured such that the minimum noise suppression filter value depends on a characteristic of the audio signal. In addition, the apparatus comprises a filter for filtering the audio signal, wherein the filter is adjusted based on the noise suppression filter values.

The described embodiment delivers an advantage in offering an improved audio quality of a processed audio signal.

The improvement is due to noise suppression filter values which are used to filter a signal, where the noise suppression filter values are adjusted so that they are greater or equal to the minimum noise suppression filter value. Choosing the noise suppression filter value in the described way is advantageous, so that signal distortions can be avoided caused by the signal processing due to small noise suppression filter values. Furthermore, the choice of the minimum noise suppression filter value is performed in a flexible way based on a characteristic of the audio signal. The flexibility of the minimum noise suppression filter value can for example be realized so that a small minimum noise suppression value is determined when the characteristic of the audio signal is large or the minimum noise suppression filter value can be set to a large value when the characteristic of the audio signal is small. Thereby, the minimum noise suppression filter can be adjusted for a large variety of potential audio signals. Through filtering the audio signal with the described noise suppression filter values, an audio signal with higher quality can be obtained, for example characterized by a more constant noise level due to the noise suppression. In addition, a more comfortable listening experience of the processed audio signal can be achieved as the filter effectively suppresses noise due to the flexible minimum noise suppression filter value.

Moreover, the described apparatus can be advantageous for processing an audio signal, so that an undesired signal component, for example a background noise component, is suppressed or attenuated and a desired signal component is preserved or enhanced. In particular, when for example a speech signal is considered as a desired component of the audio signal, the described embodiment allows preservation of the speech signal. Furthermore, the speech signal's intelligibility can be increased due to a reduction of an undesired signal component. Moreover, for example hearing impaired listeners can greatly benefit from a signal after processing with the aforementioned embodiment as the intelligibility of a speech signal is a subject of paramount importance to hearing impaired people. Additionally, the described embodiment enables a comfortable listening experience to a listener, as undesired and distracting components of the signal are attenuated or removed. Furthermore, the described embodiment enables enhancing a desired signal component, when the audio signal was for example acquired by a microphone and the desired signal component's energy varies due to for instance varying distance to the microphone of a source, varying microphone sensitivity or a varying amount of energy emitted by a source, (e.g. a speaking person).

According to an advantageous embodiment, the audio signal analyzer is configured to determine the noise suppression filter values using a maximum decision based on a plurality of unconstrained noise suppression filter values and the minimum noise suppression filter value, the minimum noise suppression filter value being equal for the plurality of bands of the audio signal. An audio signal analyzer as described above can be advantageous in avoiding speech distortions or musical tones, for example due to aggressive noise suppression. For instance, when a noise suppression filter value for a band is estimated based on a SNR (=Signal-to-Noise Ratio) and for example an unreliable SNR estimator is employed, indicating an SNR of 0, where there is still some desired signal component present, a band can be completely suppressed. The total suppression of a band can lead to undesired artefacts, for example speech distortion, when speech was actually present in the band, or musical tones, for example due to noise shaping. Additionally, the described embodiment facilitates a same amount of minimum noise suppression for a plurality of bands.

According to an advantageous embodiment the audio signal analyzer is configured to calculate a gain value from a frame of the audio signal as the characteristic of the audio signal. A gain value can be advantageous for enhancing the audio signal. For example, when the audio signal contains a desired signal component with a strongly varying energy, the gain value can be applied to the signal in order to compensate for the variation of the energy. For instance, when the desired signal component is a speech signal the intelligibility can greatly benefit from the application of a gain value to the audio signal. Furthermore, for example listening comfort can also be increased, when by application of the gain value a more constant desired signal energy is achieved.

According to an advantageous embodiment, the audio signal analyzer is configured to calculate the minimum noise suppression filter value based on a predetermined noise suppression value and the gain value. Calculating the minimum noise suppression filter value as described before can be beneficial to adapt a minimum noise suppression filter value so that, although a desired signal component of the audio signal can be amplified by application of the gain value an undesired signal component, for example background noise, can still be efficiently suppressed. Therefore, for example an overall system response of the described advantageous embodiment for an undesired signal component will not be amplifying, i.e. the undesired signal component will be attenuated or pass unaltered.

In a further advantageous embodiment, the audio signal analyzer is configured to calculate the minimum noise suppression filter value so that the minimum noise suppression filter value decreases with an increasing gain value. The described inverse proportionality between the minimum noise suppression filter value and the gain value can be beneficial when applying the gain value to the audio signal. For example, when a large gain value is provided, a noise component of the audio signal subject to the gain value will be amplified accordingly. Therefore, reducing the minimum noise suppression filter proportional to the gain value can lead to a constant overall noise suppression achieved by the advantageous embodiment.

In a further advantageous embodiment, the audio signal analyzer is configured to calculate the minimum noise suppression filter value using a minimum decision on a predetermined noise suppression value and a quotient of a predetermined noise suppression value and the gain value. Using a minimum decision as described above can be beneficial to achieve a comfortable listening experience, as for example when small gain values are provided the quotient of predetermined noise suppression value and gain value is large. Therefore, a noise reduction based on this quotient can result in an insufficient amount of noise being reduced, whereas in the described advantageous embodiment a minimum noise suppression is ensured. Thereby, a comfortable listening experience can be provided, as noise is at least reduced to a desired predetermined amount.

In a further advantageous embodiment, the audio signal analyzer is configured to determine the minimum noise suppression filter value according to a first minimum decision, the first minimum decision being dependent on a predetermined noise suppression value and a result of a second minimum decision. The result of the second minimum decision is dependent on an inverse of the gain value and a result of a maximum decision. The result of the maximum decision is dependent on the inverse of a predetermined distortion limit value and a quotient of the predetermined noise suppression value and the gain value. The described configuration of the audio signal analyzer can be beneficial in order to reduce noise reduction artifacts, like for example speech distortions due to aggressive noise suppression. In particular, large gain values can lead to a small quotient of predetermined noise suppression value and gain value, potentially resulting in values close to 0 and therefore potentially causing signal distortions when applied as minimum noise suppression value. Employing a lower bound as described in the advantageous embodiment, performed by the maximum decision involved in estimating the minimum noise suppression filter value, avoids this possibility, enabling a potentially more comfortable listening experience.

In a further advantageous embodiment, the audio signal analyzer is configured to determine the minimum noise suppression filter value so that same is equal to a predetermined noise suppression value, when the gain value is between 0 and 1, or same is equal to a quotient of the predetermined noise suppression value and the gain value, when the gain value is greater than 1. The described configuration for the audio signal analyzer is advantageous in order to provide a flexible minimum noise suppression filter value dependent on the gain value, so that a large gain value will not reduce the achievable noise reduction.

In a further advantageous embodiment, the audio signal analyzer is configured to determine the minimum noise suppression filter value so that it is equal to a predetermined noise suppression value when the gain value is between 0 and 1. Otherwise, the minimum noise suppression filter value is equal to a quotient of the predetermined noise suppression value and the gain value when the gain value is between 1 and the product of the predetermined noise suppression value and a predetermined distortion limit. Otherwise, the minimum noise suppression filter value is equal to an inverse value of the predetermined distortion limit when the gain value is greater than a product of the predetermined noise suppression value and the predetermined distortion limit and smaller than the predetermined distortion limit. Otherwise, the minimum noise suppression filter value is equal to an inverse value of the gain value when the gain value is bigger than the predetermined distortion limit. An audio signal analyzer configured as described above is beneficial in avoiding speech distortion or musical tones by providing a bigger minimum noise suppression filter value even for large gain values, thereby avoiding aggressive noise suppression.

In a further advantageous embodiment, the audio signal analyzer is configured to analyze a band of the plurality of bands of the audio signal to determine whether the band has a first characteristic of the audio signal or a second characteristic of the audio signal, wherein the first characteristic is different from the second characteristic. Furthermore, the audio signal analyzer is configured to determine the noise suppression filter values when a second characteristic has been determined for the band, so that the noise suppression filter values are equal to a product of a predetermined noise suppression value and the gain value, when the gain value is between 0 and 1. Otherwise, the noise suppression filter values are equal to the predetermined noise suppression value when the gain value is between 1 and the product of the predetermined noise suppression value and a predetermined distortion limit. Otherwise, the noise suppression filter values are equal to the quotient of the gain value and the predetermined distortion limit when the gain value is greater than the product of the predetermined noise suppression value and the predetermined distortion limit, and smaller than the predetermined distortion limit. Otherwise, the noise suppression filter values are equal to one when the gain value is greater than the predetermined distortion limit. An audio signal analyzer as described above can be beneficial for providing noise suppression filter values in scenarios when for example the second characteristic describes a noise content of the audio signal. The second characteristic may be a non-active frame or band, as for example a voice activity indicates that no voice is present in the frame or the band. In the described noise scenario the overall system response does not result in an amplification of the noise.

In a further advantageous embodiment, the audio signal analyzer is configured to calculate for a first frame of the audio signal, a first gain value resulting in a first minimum noise suppression value. Furthermore, the audio signal analyzer is configured to calculate, for a second frame of the audio signal, a second gain value resulting in a non-smoothed second minimum noise suppression filter value, wherein the second frame follows the first frame in time. Moreover, the audio signal analyzer is configured to calculate a smoothed minimum noise suppression filter value for the second frame using the non-smoothed second minimum noise suppression filter value and the first minimum noise suppression filter value. An audio signal analyzer configured as described above can be beneficial for avoiding large fluctuations in the minimum noise suppression filter value, thereby providing a smooth residual noise level avoiding an uncomfortable noise pumping effect.

In a further advantageous embodiment, the apparatus comprises a first time-frequency converter providing a frequency-domain representation of the audio signal providing the plurality of bands of the audio signal. In addition, the audio signal analyzer is configured to calculate a noise suppression filter value for a band of the plurality of bands of the audio signal based on one or more bands of the plurality of bands of the audio signal and the minimum noise suppression value. Moreover, the minimum noise suppression filter value is based on a predetermined noise suppression value which is equal for each band of the plurality of bands of the audio signal, or a predetermined distortion limit which is equal for a plurality of bands of the audio signal, and a value derived from the characteristic of the audio signal, the value being equal for each band of the plurality of bands of the audio signal. The value derived from the characteristic of the audio signal can for example be a gain value. Furthermore, an apparatus as described above can be beneficial in providing a flexible spectral resolution based on the first time-frequency converter, thereby enabling individual treatment for each band of the plurality of bands of the audio signal.

In a further advantageous embodiment, the filter is configured to modify each band of the plurality of bands of the audio signal by applying the noise suppression filter values for the band to obtain a second plurality of bands. Furthermore, the apparatus comprises a second time-frequency converter which is configured to provide a time-domain output signal from the second plurality of bands. An apparatus as described above can be beneficial in producing an audible audio signal at the output derived from the second plurality of bands.

In a further advantageous embodiment, the apparatus comprises a second time-frequency converter which is configured to provide a time-domain transformation of the noise suppression filter values, provided by the audio signal analyzer. Furthermore, the filter is configured to provide an output audio signal, obtained by convolving the time-domain transformed noise suppression filter values and the audio signal. An apparatus as described above is advantageous for obtaining a low delay system operating close to real-time, as no delay due to a frame-based processing is necessary for the filtering.

In a further advantageous embodiment, the audio signal analyzer is configured to calculate an amplitude information of the audio signal. In addition, the audio signal analyzer is configured to calculate a gain value, as a (value derived from a) characteristic of the audio signal, based on the amplitude information (characteristic of the audio signal) and a predetermined target value, to which the audio signal is adjusted to by means of the gain value. The provided gain value can be beneficially employed to, e.g. amplify or attenuate the signal to a target value, due to for example varying energy of a desired signal component in the audio signal.

In a further embodiment, the audio signal analyzer is configured to filter the audio signal with a psychoacoustic filter before calculation of the amplitude information. Moreover, the psychoacoustic filter is configured to exhibit a first attenuation value for a first frequency range, and a second attenuation value for a second frequency range, and a third attenuation value for a third frequency range. Furthermore, the filter is configured so that the second frequency range is between the first frequency range and the third frequency range. The first frequency range, the second frequency range and the third frequency range can be configured to be non-overlapping. Furthermore, the filter is configured so that the second attenuation value is smaller than the first attenuation value and the third attenuation value. A calculation of the amplitude information dependent on a psychoacoustic filter, as described above, can be beneficial in providing a subjectively more suitable calculation of the gain value based on the amplitude information. A gain value calculated based on a psychoacoustic measure, for example dB(A), dB(B) or dB(C), can lead to a more comfortable listening experience when applied to the audio signal.

In a further advantageous embodiment, the audio signal analyzer comprises a voice activity detection unit providing a first voice activity information of the first frame of the audio signal, and a second voice activity information of the second frame of the audio signal, and a memory unit to store a previous gain value. Furthermore, the audio signal analyzer is configured to estimate a gain value based on a second frame of the audio signal in which voice has been detected according to the second voice activity information. Alternatively, the audio signal analyzer is configured to keep a gain value of a first frame if no voice activity has been detected in the second frame according to the second voice activity information, when voice has been detected in the first frame based on the first voice activity information, wherein the second frame follows the first frame in time. An apparatus as described above can be advantageous in avoiding computation of the gain value in segments of an audio signal wherein no signal of interest is present, thereby avoiding for example amplification of undesired signal components.

In an advantageous embodiment, the audio signal analyzer is configured to calculate the minimum noise suppression value for a current frame based on a value derived from a characteristic of the audio signal calculated for a current frame. Furthermore, the audio signal analyzer is configured to analyze the audio signal for determining the value derived from a characteristic of the audio signal. Moreover, the filter comprises a first filter stage and a second filter stage, wherein the first filter stage is adjusted using the value derived from the characteristic of the audio signal (e.g. a gain value). In addition, the second filter stage is adjusted according to the noise suppression filter values. The described advantageous embodiment enables a flexible filter structure, as for example the first stage can follow the second stage as they are not dependent on each other.

In a further advantageous embodiment, the audio signal analyzer is configured to calculate a minimum noise suppression value for a second frame based on a value derived from the characteristic of the audio signal, calculated for a first frame. In addition, the filter comprises a first filter stage and a second filter stage, wherein the first filter stage is adjusted according to the noise suppression filter values and wherein a second filter stage is adjusted using the value derived from the characteristic of the audio signal. Moreover, the audio signal analyzer is configured to analyze an output of the first filter stage for determining the value derived from a characteristic of the audio signal, wherein the second frame follows the first frame in time. An audio signal analyzer, configured as described above, is beneficial for enabling a flexible and low delay filtering of the audio signal, as a previously computed gain value can be employed.

In a further advantageous embodiment, the audio signal analyzer is configured to determine the gain value based on a voice activity information and the audio signal. Alternatively, an audio signal analyzer is configured to determine the gain value based on a voice activity information and the audio signal after being filtered by the noise suppression filter values. Moreover, the audio signal analyzer is configured to obtain the voice activity information based on the audio signal. Additionally, the audio signal analyzer is configured to obtain the voice activity information based on the audio signal after being filtered by the filter. Alternatively, the audio signal analyzer is configured so that a voice activity information indicating no speech present is used to decrease the gain value. An audio signal analyzer as described above offers flexibility in terms of which signal is used for gain calculation or which signal is used for voice activity detection and avoids noise amplification by decreasing the gain value during speech pauses or even applying no gain during speech pauses.

Embodiments of the present invention provide a method for processing an audio signal, the method comprising: analyzing an audio signal to determine a plurality of noise suppression filter values for a plurality of bands of the audio signal, determining the noise suppression filter values so that a noise suppression filter value is greater than or equal to a minimum noise suppression filter value, and so that the minimum noise suppression filter value depends on a characteristic of the audio signal; and filtering the audio signal based on the noise suppression filter values. The described method is advantageous, for example, when the characteristic of the audio signal is used to estimate a gain value which can be applied to the audio signal. Additionally, a flexible noise suppression filter can be adjusted to this value by appropriate choice of the useful noise suppression filter values in dependence of the gain value. Thereby, amplification of an undesired signal component can be avoided and a preservation or enhancement of a desired component can be achieved, enabling a comfortable listening experience.

A further advantageous embodiment includes a computer program with a program code for performing the method when the computer program runs on a computer or a microcontroller.

Furthermore, aspects relate to an apparatus for analyzing an audio signal for determining noise suppression filter values, wherein a minimum suppression filter value depends on a characteristic of the audio signal, and filtering the audio signal based on the noise suppression filter values.

Furthermore, embodiments of the invention relate to apparatuses and methods for joint noise reduction and automatic gain control providing the means to automatically control the speech signal level in an output signal, while preventing arbitrary amplification or rapid fluctuations of a noise level. Further embodiments of the invention describe apparatuses and methods including a control mechanism to mitigate signal distortions for large gain values, for example AGC (=Automatic Gain Control) gains. In addition, an embodiment of the invention relates to jointly perform NR (=Noise Reduction) and AGC. A further aspect of the invention is to provide an automatic gain control mechanism for a desired speech component, while preventing arbitrary amplification and undesired fluctuations of a noise level.

Moreover, aspects of the present invention relate to the field of processing audio signals, more specifically to an approach for automatically adjusting the level of an audio signal, for example an audio signal containing some desired speech components as well as some undesired noise components.

Additionally, aspects of the invention relate to an embodiment for joint noise reduction and automatic gain control providing the means to automatically control the speech signal level in an output signal, while preventing arbitrary amplification or rapid fluctuations of the noise level. Aspects of the invention further includes a control mechanism to mitigate signal distortions for large AGC gains.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
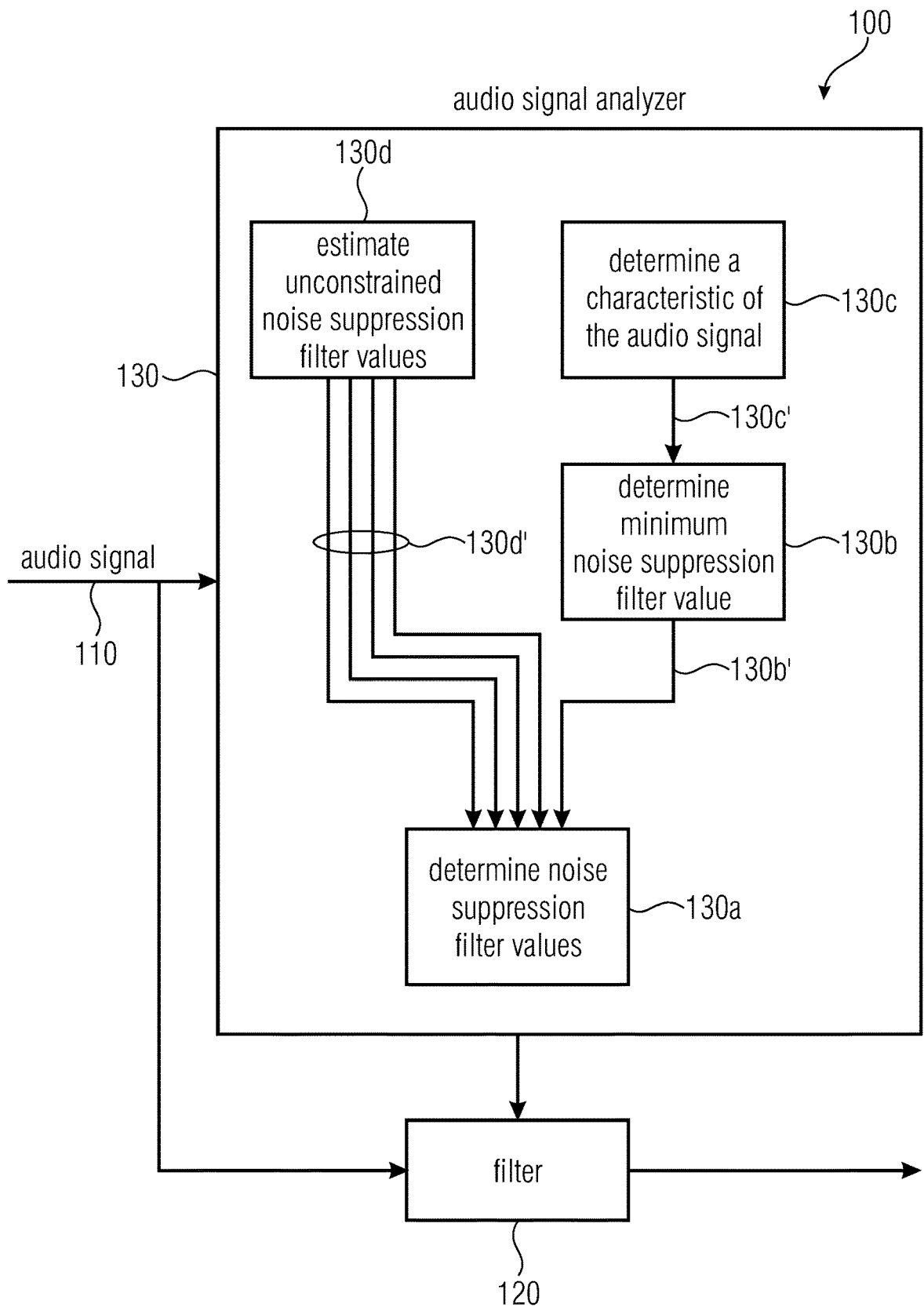
FIG. 1 shows a block diagram of an embodiment according to the invention.

FIG. 1 depicts a block diagram of an apparatus 100 according to an embodiment of the invention for processing an audio signal 110, wherein the audio signal 110 can be provided in a spectral representation, with a filter 120 adjusted according to noise suppression filter values provided by an audio signal analyzer 130. The noise suppression filter values are determined 130*a* in the audio signal analyzer, so that they are greater than a minimum noise suppression filter value 130*b*'. The minimum noise suppression filter value 130*b*' is determined in 130*b* based on a characteristic of the audio signal 130*c*' which is determined in the audio signal analyzer 130 in 130*c*. In addition, the estimation is based on unconstrained noise suppression filter values 130*d*' which are estimated in 130*d* for a plurality of bands of the audio signal. Furthermore, the characteristic of the audio signal 130*c*' is equal for a plurality of bands of the audio signal. The unconstrained noise suppression filter values 130*d*' can be estimated for example according to an optimal filter like the Wiener filter, based on the Power Spectral density (PSD) $\sigma_x^2(m, k)$ of the audio signal 110, for example the input audio signal, and the PSD of the noise $\sigma_n^2(m, k)$ contained in the audio signal 110

$$H_{NR,Wiener}(m, k) = \frac{\sigma_x^2(m, k) - \sigma_n^2(m, k)}{\sigma_x^2(m, k)},$$

where for example m is the time frame index and k is the spectral subband index. The Wiener filter $H_{NR,Wiener}(m, k)$ extracts a desired signal from a noisy signal, computed as described above. In practice, the PSDs have to be estimated for a Wiener filter.

An enhanced signal can be obtained in the frequency domain by multiplying the plurality of bands of the audio signal, for example an input spectrum, with the above filter $H_{NR,Wiener}(m, k)$, for example on a frame-by-frame basis.

By observing that the SNR can be defined as $$SNR(m, k) = \frac{\sigma_x^2(m, k) - \sigma_n^2(m, k)}{\sigma_n^2(m, k)}$$

the equation for the Wiener filter $H_{NR,Wiener}(m, k)$ can be reformulated as $$H_{NR,Wiener}(m, k) = \frac{SNR(m, k)}{1 + SNR(m, k)}.$$

Hence, the Wiener Filter $H_{NR,Wiener}(m, k)$ takes the value zero for SNR(m, k)=0, and converges to one for large SNR values, which is the desired behavior to attenuate the noise while preserving the desired signal components. Alternatively, filters of different types like the spectral amplitude estimator [4] can be used for estimating the unconstrained noise suppression filter values. Moreover, the unconstrained noise suppression filter values can be based on a heuristic function.

The audio signal 100 can comprise a desired component, for example speech, and some undesired component, for example background noise. The filter 120 is adjusted by the signal analyzer 130, so that for example a speech signal component of the audio signal 110 will be more intelligible after filtering the audio signal 110 with the filter 120. In addition, an undesired component of the audio signal 110 can be suppressed after filtering the audio signal 110 with the filter 120. A minimum noise suppression filter value, which acts as a constraint on the unconstrained noise suppression filter values, enables a signal enhancement and avoids speech distortion or musical tones.

The apparatus 100 facilitates enhancement of a desired signal component of an audio signal 110, while offering a tradeoff between signal enhancement and noise suppression. This tradeoff is characterized by the minimum noise suppression filter value acting as a constraint, as it can be adjusted to either remove more of the undesired signal component or reduce the removal of undesired signal components in order to avoid signal distortions.

Figure 2:
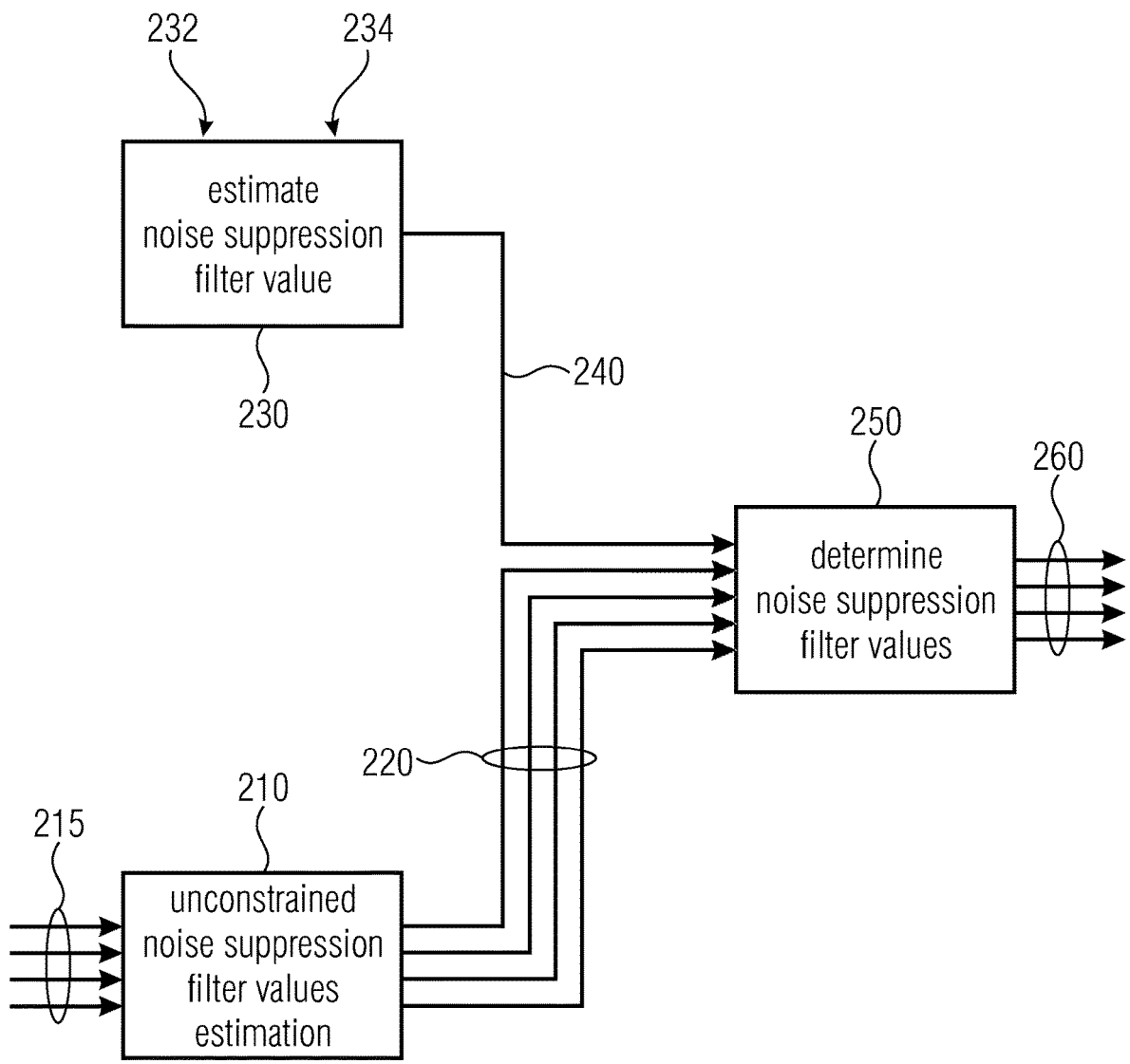
FIG. 2 shows a block diagram of an audio signal analyzer of the embodiment of the apparatus in accordance with FIG. 1.

FIG. 2 shows a block diagram of the audio signal analyzer 130 of an embodiment of the invention according to apparatus 100 as depicted in FIG. 1. The audio signal analyzer 130 performs an unconstrained noise suppression filter value estimation 210, based on a plurality of bands of the audio signal 215. For each band of the plurality of bands of the audio signal 215, an unconstrained noise suppression filter value 220 is estimated in the audio signal analyzer 130. In addition, a minimum noise suppression value estimation 230 is performed, based on a value derived from a characteristic of the audio signal 232 (e.g. a gain value) and a predetermined noise suppression value 234. The unconstrained noise suppression filter values 220 and the minimum noise suppression filter value 240 are used to determine the noise suppression filter values 250. This can be done for example by performing a maximum operation, so that a plurality of noise suppression filter values 260 for a plurality of bands of the audio signal 215 are obtained. The noise suppression filter values 260 which are obtained by the maximum operation 250 are ensured to be greater than the minimum noise suppression filter value 240, thereby small values or values equal to 0 of the noise suppression filter values can be avoided. By avoiding small values or values equal to 0 of the noise suppression filter values 260, the achievable noise suppression is limited by the minimum noise suppression filter 240 value, avoiding potential distortion due to aggressive noise suppression.

Figure 3:
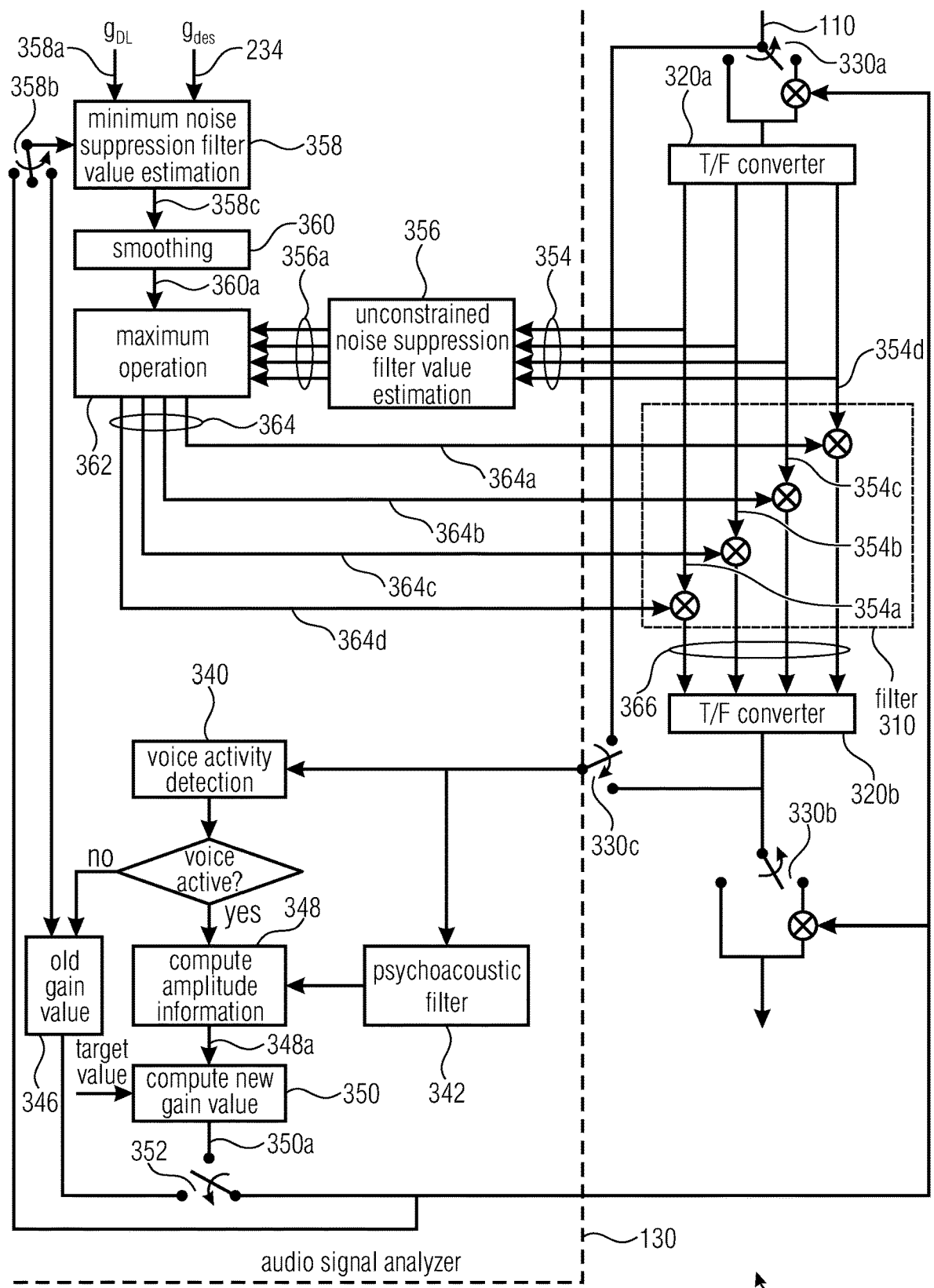
FIG. 3 shows a block diagram of an embodiment of an apparatus according to the invention.

FIG. 3 shows a block diagram of an apparatus 300 according to an advantageous embodiment of the invention. The apparatus 300 comprises an audio signal analyzer 130 and a filter 310. Furthermore, the apparatus 300 comprises a first time-frequency converter 320a and a second time-frequency converter 320b. Moreover, the apparatus 300 allows application of a gain value to the audio signal 110 before or after filtering the audio signal 110 with the filter 310. This optionality is indicated by the switches 330a and 330b. Moreover, the apparatus 300 comprises another switch 330c, which enables to calculate a value derived from a characteristic of the audio signal 110 (e.g. a gain value), before or after filtering the audio signal 110 with the filter 310. Furthermore, the audio signal analyzer 130 comprises a voice activity detection 340, a psychoacoustic filter 342 and a memory unit 346. Depending on the result of the voice activity detection 340, a characteristic of the audio signal 348a, for example an amplitude information, is computed 348 based on the audio signal 110 filtered by the psychoacoustic filter 342, when voice has been detected.

Moreover, when voice has been detected by the voice activity detection 340, a new gain value is computed 350 based on the amplitude information 348a and a target value. Furthermore, a switch 352 enables usage of an old gain value, kept in the memory unit 346, when no voice has been detected by the voice activity detection 340. In contrast, when voice has been detected by the voice activity detection 340, the old gain value in the memory 346 will be overwritten by the gain value of the current frame 350a.

Moreover, the audio signal analyzer 130 is configured to compute unconstrained noise suppression filter values 356, based on a plurality of bands of the audio signal 354, for example based on a Wiener filter. In addition, the audio signal analyzer 130 is configured to estimate a minimum noise suppression filter value 358, which is based on a predetermined noise suppression value $g_{des}$ 234, for example a noise attenuation limit $g_{lim}$, or a predetermined distortion limit 358a and a value derived from a characteristic of the audio signal, for example the gain value. If no voice activity has been detected by the voice activity detection 340, in the current frame, the minimum noise suppression filter value estimation 358 can rely for computation of the minimum noise suppression value 358c on a gain value which is stored in the memory unit 346. If voice is active in the current frame, the current gain value can be employed for the minimum noise suppression value estimation 358, the choice between old and new gain value is facilitated by a switch 358b.

The minimum noise suppression filter value 358c, obtained in the minimum noise suppression filter value estimation 358, can be subject to optional smoothing 360. The smoothed or non-smoothed minimum noise suppression filter value 360a, which is equal for a plurality of bands of the audio signal 354, and a plurality of unconstrained noise suppression filter values 356a, obtained by the unconstrained noise suppression filter value estimation 356, are subject to a maximum operation 362. The maximum operation 362 provides noise suppression filter values 364, for a plurality of bands of the audio signal 354, for adjusting the filter 310.

In its simplest form, a constant minimum noise suppression value is applied. The Wiener filter $H_{NR,Wiener}(m, k)$ takes the value zero for SNR $(m, k)=0$, and converges to one for large SNR values, which is the desired behavior to attenuate the undesired signal components, e.g. noise, while preserving the desired signal components, e.g. speech, of the audio signal. A constant minimum noise suppression filter value $g_{lim}=g_{des}$ can be employed to avoid aggressive noise reduction. Therefore, the noise suppression filter values are limited to a maximum noise attenuation amount as follows:

$$G_{NR,Wiener}(m, k) = \max\{H_{NR,Wiener}(m, k); g_{lim}\}$$
$$= \max\{H_{NR,Wiener}(m, k); g_{des}\},$$

described here for the Wiener filter based unconstrained noise suppression filter values $H_{NR,Wiener}(m, k)$, but can accordingly also be applied to differently obtained unconstrained noise suppression filter values $H_{NR}(m, k)$. The noise attenuation limit $g_{lim}$ is defined as $0 \leq g_{lim} \leq 1$. It corresponds to the maximum noise attenuation of the filter $G_{NR,Wiener}(m, k)$, which can also be interpreted as the desired amount of noise attenuation during speech pauses, i.e. $g_{lim}=g_{des}$. It is typically chosen between −20 dB and −10 dB. As other filtering rules can also be employed instead of the Wiener filter the above described equation can be generalized as follows:

$$G_{NR}(m,k)=\max\{H_{NR}(m,k);g_{des}\},$$

where $H_{NR}(m, k)$ refers to arbitrary unconstrained noise suppression filter values, based on an arbitrary noise reduction rule.

The filter 310 applies to each band of the audio signal 354a-d an appropriate value of the noise suppression filter values 364a-d. By filtering the plurality of bands of the audio signal 354 with the filter 310 a second plurality of bands 366 is obtained. The second plurality of bands 366 can be transformed into the time domain with the second time-frequency converter 320b, so that an audible signal is obtained.

In addition, the multiplication with a gain value before or after filtering the audio signal 110, indicated with the switches 330a and 330b, enables the apparatus 300 to compensate a lower level of a desired signal component in the audio signal 110. Furthermore, the apparatus 300 provides by filtering the audio signal 110 in the frequency domain with the filter 310, a power saving due to operation in the frequency domain compared to a time domain-based convolution.

For a given AGC gain value $G_{AGC}(m)$, as a value derived from a characteristic of the audio signal 110, the joint NR+AGC task is considered as a filtering problem where the desired signal is not anymore the desired signal component of the audio signal 110, for example a speech signal, itself, but the desired signal component scaled by the AGC gain. Deriving for example the Wiener filter extracting the scaled desired signal component, for example a speech signal, from a noisy input signal, we obtain the following filtering rule:

$$H_{NR+AGC,Wiener}(m,k) = \frac{\sigma_x^2(m,k) - \sigma_n^2(m,k)}{\sigma_x^2(m,k)} G_{AGC}(m),$$

which can be reformulated as function of the Wiener filter $H_{NR,Wiener}(m, k)$, as described above for noise reduction:

$$H_{NR+AGC,Wiener}(m,k)=H_{NR,Wiener}(m,k)G_{AGC}(n),$$

where $G_{AGC}(m)$ is a gain value, e.g. an AGC scaling factor.

As described before, a noise attenuation limit $g_{lim}=g_{des}$ to limit the signal distortion is introduced:

$$G_{NR+AGC,Wiener}(m,k) = \max\{H_{NR+AGC,Wiener}(m,k); g_{des}\}$$
$$= \max\{H_{NR,Wiener}(m,k)G_{AGC}(m); g_{des}\}$$
$$= \max\left\{H_{NR,Wiener}(m,k); \frac{g_{des}}{G_{AGC}(m)}\right\} \times G_{AGC}(m).$$

Therefore, from inspection of $G_{NR+AGC,Wiener}(m, k)$, it is visible that performing NR and AGC jointly is equivalent to applying the AGC scaling factor $G_{AGC}(m)$ at the output of a Wiener filter (or equivalently at its input), subject to a minimum noise suppression value, e.g. a noise attenuation limit, which is proportional to the AGC gain.

Moreover, the above described equation for $G_{NR+AGC,Wiener}(m, k)$ can be generalized to arbitrary optimum or heuristic filtering rules, yielding $$G_{NR+AGC}(m, k) = \tilde{G}_{NR}(m, k; G_{AGC}) \times G_{AGC}(m),$$

where $$\tilde{G}_{NR}(m, k; G_{AGC}) = \max\left\{H_{NR}(m, k); \frac{g_{des}}{G_{AGC}(m)}\right\}.$$

In addition, the minimum noise suppression value and therefore the noise suppression filter values can be estimated by performing AGC and NR processing in a joint manner as this allows to better control the level of a desired signal component of the audio signal 110, for example speech, and noise levels at the output. A VAD(=Voice Activity Detection) is exploited to trigger the level estimation and gain computation steps, but multiplication of the NR output signal with AGC gain is carried out for each frame, regardless of the speech activity. According to an aspect of the invention, the filtering does not rely on a fixed minimum noise suppression value, e.g. a fixed noise attenuation limit. In contrast, a value derived from a characteristic of the audio signal 110, e.g. an AGC-gain, dependent (and hence for example time-varying) minimum noise suppression filter value, e.g. noise attenuation limit $\tilde{g}_{lim}^{[UC]}(m; G_{AGC})$ is applied, yielding the NR filter $$\tilde{G}_{NR}^{[UC]}(m,k;G_{AGC})=\max\{H_{NR}(m,k);\tilde{g}_{lim}^{[UC]}(m; G_{AGC})\},$$

where $\tilde{g}_{lim}^{[UC]}(m; G_{AGC})$ is adapted on a frame-by-frame basis as a function of the desired noise attenuation $g_{des}$ ($0 \leq g_{des} \leq 1$) and the AGC gain. The superscript [UC] refers to the unconstrained case, in contrast to the constrained case presented later on.

According to an aspect of the invention, the gain value dependent minimum noise suppression filter value, e.g. a noise attenuation limit, $\tilde{g}_{lim}^{[UC]}(m; G_{AGC})$ can be obtained according to $g_{des}/G_{AGC}(m)$. According to a further aspect, the minimum noise suppression value, e.g. a unconstrained noise attenuation limit, is defined in a different way to obtain a better attenuation of the noise when the AGC attenuates the signal (i.e. $G_{AGC}(m)<1$):

$$\tilde{g}_{lim}^{[UC]}(m; G_{AGC}) = \min\left\{g_{des}; \frac{g_{des}}{G_{AGC}(m)}\right\}.$$

The AGC gain is not used to scale the NR gains as a function of the AGC gain. Instead the AGC gain is directly included in the NR filter $\tilde{G}_{NR}^{[UC]}(m, k; G_{AGC})$ design via the minimum noise suppression filter value $\tilde{g}_{lim}^{[UC]}(m; G_{AGC})$, e.g. the noise attenuation limit.

To illustrate the advantage of using the time-varying noise attenuation limit $\tilde{g}_{lim}^{[UC]}(m; G_{AGC})$ instead of a fixed limit $g_{lim}=g_{des}$, the response of the overall filter $$\tilde{G}_{NR+AGC}^{[UC]}(m,k)=\tilde{G}_{NR}^{[UC]}(m,k;G_{AGC})\times G_{AGC}(m)$$

is derived for time-frequency regions dominated either by the speech (high SNR) or by the noise (low SNR):

Case $G_{AGC}(m) \geq 1$

In low-SNR time-frequency regions dominated by the noise, we can assume that the NR filter $\tilde{G}_{NR}^{[UC]}(m, k; G_{AGC})$ reaches its minimum $\tilde{g}_{lim}^{[UC]}(m; G_{AGC})$ and hence the overall system response $\tilde{G}_{NR+AGC}^{[UC]}$ (m, k) becomes:

$$\tilde{G}_{NR+AGC}^{[UC]}(m,k)|_{SNR=0} \approx \tilde{g}_{lim}^{[UC]}(m; G_{AGC}) \times G_{AGC}(m) = g_{des},$$

which shows that segments dominated by the noise are scaled by the desired amount of noise reduction, regardless of the AGC gain.

In high-SNR time-frequency regions dominated by the speech, we can assume that the NR filter leaves the speech mostly unchanged, i.e. $\tilde{G}_{NR}^{[UC]}$(m, k; $G_{AGC}$)≈1, and hence the total response becomes:

$$G_{NR+AGC}^{[UC]}(m,k)|_{SNR>>1} \approx G_{AGC}(m),$$

which shows that segments dominated by the speech are scaled by the AGC gain as desired, regardless of the desired amount of noise reduction.

Case $G_{AGC}$ (m)<1

Using the same reasoning as above, we can write $$G_{NR+AGC}^{[UC]}(m,k)|_{SNR=0} \approx \tilde{g}_{lim}^{[UC]}(m) \times G_{AGC}(m) = g_{des} \times G_{AGC}(m),$$

$$G_{NR+AGC}^{[UC]}(m,k)|_{SNR>>1} \approx G_{AGC}(m),$$

which shows that the speech segments are scaled by the AGC gain $G_{AGC}$(m) as expected, and the noise is at least attenuated by the desired noise attenuation amount $g_{des}$.

It is therefore visible that adapting the noise attenuation limit as a function of the desired noise attenuation and the AGC gain according to $$\tilde{g}_{lim}^{[UC]}(m; G_{AGC}) = \min\left\{g_{des}; \frac{g_{des}}{G_{AGC}(m)}\right\}$$

provides full control over the speech and noise levels at the system output for positive AGC gains. Therefore, consistent speech and noise levels can be achieved and noise pumping effects can be avoided, as depicted in graph 1250.

When the AGC attenuates the input signal, i.e. $G_{AGC}$ (m)<1, we see from $$G_{NR+AGC}^{[UC]}(m,k)|_{SNR=0} \approx \tilde{g}_{lim}^{[UC]}(m) \times G_{AGC}(m) = g_{des} \times G_{AGC}(m),$$

that the noise is not amplified at the output compared to the input, and a minimum amount of noise attenuation is ensured. In this case, note that this introduces a low-level but time-varying noise floor caused by the time-varying AGC attenuation. However, it can be assumed in practice that the input speech level remains relatively constant. Provided that the VAD can detect the speech presence accurately, the AGC gain will hence fluctuate only slowly after convergence, and the absolute noise level at the system output will vary only slowly, which avoids the noise pumping effect.

As presented before, the minimum noise suppression filter value 360a is derived as a function of the desired noise attenuation and the AGC gain. This can be achieved for instance based on $$\tilde{g}_{lim}^{[UC]}(m; G_{AGC}) = \min\left\{g_{des}; \frac{g_{des}}{G_{AGC}(m)}\right\}.$$

This approach can produce an arbitrarily small noise attenuation limit for large AGC gains $G_{AGC}$(m). When applying aggressive noise reduction audible artefacts can occur in practice. Typical artefacts occurring are:

speech distortions, especially at high frequencies where speech is the weakest, musical tones characterized by a highly non-stationary coloration of the background noise.

To obtain a less aggressive noise reduction, i.e. a moderate noise reduction, for large AGC gains and hence to mitigate the noise reduction artefacts, a constraint can be imposed on the noise attenuation limit. According to one aspect of the invention, the minimum noise suppression filter value 360a is computed as a function of the AGC gain $G_{AGC}$(m), the predetermined noise suppression value $g_{des}$ 234, e.g. the desired amount of noise attenuation, and a distortion limit $g_{DL}$ 358a, yielding $$\tilde{g}_{lim}^{[DC]}(m; G_{AGC}) = \min\left\{g_{des}; \min\left\{\frac{1}{G_{AGC}(m)}; \max\left\{\frac{1}{g_{DL}}; \frac{g_{des}}{G_{AGC}(m)}\right\}\right\}\right\},$$

where the superscript [DC] denotes distortion-constrained case, in contrast to the aforementioned case denoted by the superscript [UC]. This approach is illustrated in more detail in FIG. 7 and FIG. 9.

The NR filter in the distortion-constrained case is obtained in a similar way as described before, i.e.

$$\tilde{G}_{NR}^{[DC]}(m,k; G_{AGC}) = \max\{H_{NR}(m,k); \tilde{g}_{lim}^{[DC]}(m; G_{AGC})\},$$

which leads to the overall filter performing NR and AGC:

$$G_{NR+AGC}^{[DC]}(m,k) = \tilde{G}_{NR}^{[DC]}(m,k; G_{AGC}) \times G_{AGC}(m).$$

The distortion limit $g_{DL}$ 358a is a constant which may satisfy $g_{DL} \geq 1/g_{des} \geq 1$. It can also be understood as the amount of SNR improvement allowed by the system. A low $g_{DL}$ provides a good protection against noise reduction artefacts, but at the cost of a poorer attenuation of the noise. This is depicted in graph 1260, where the noise level increases as the speech gets amplified. It can be easily verified that a very large distortion limit $g_{DL}$ 358a basically alleviates the constraint and $\tilde{g}_{lim}^{[DC]}$(m; $G_{AGC}$) becomes equivalent to its unconstrained counterpart $\tilde{g}_{lim}^{[UC]}$(m; $G_{AGC}$). The distortion limit is typically chosen between 15 dB and 25 dB.

Additionally, processing tools like temporal smoothing can be used for $\tilde{g}_{lim}^{[DC]}$(m; $G_{AGC}$) or $$\tilde{g}_{lim}^{[UC]}(m; G_{AGC}) = \min\left\{g_{des}; \frac{g_{des}}{G_{AGC}(m)}\right\}$$

to smoothen the noise attenuation limit, i.e. the minimum noise suppression filter value, over time.

Figure 4:
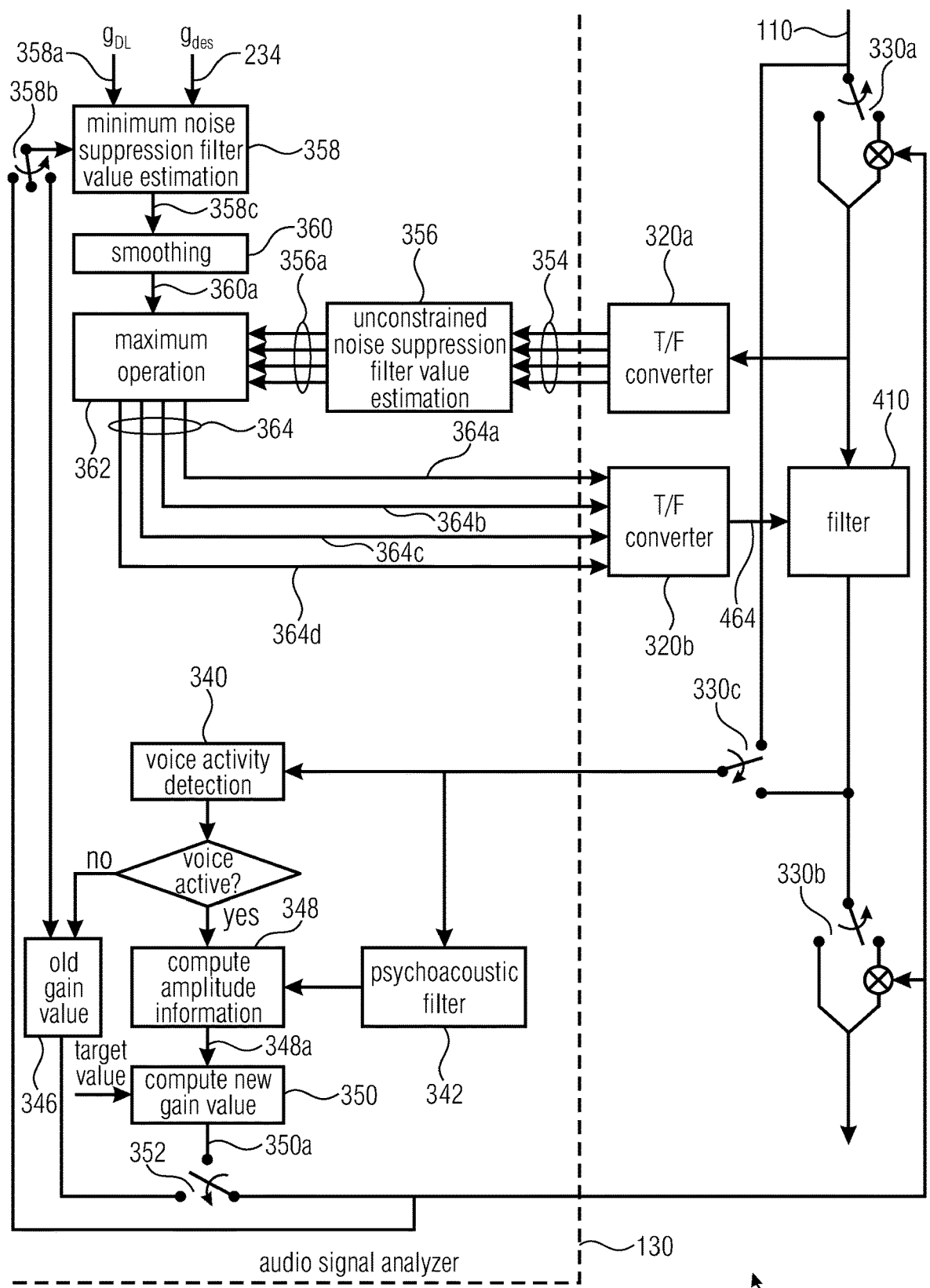
FIG. 4 shows a block diagram of an embodiment of an apparatus according to the invention.

FIG. 4 illustrates a block diagram of an apparatus 400 according to an advantageous embodiment of the invention. The apparatus 400 comprises an audio signal analyzer 130 as described in FIG. 3 for apparatus 300. In addition, the apparatus 400 comprises a first time-frequency converter 320a, which is configured to provide a plurality of bands of the audio signal 354 to the audio signal analyzer 130. Furthermore, the apparatus 400 comprises a second time-frequency converter 320b which is configured to provide a time domain representation of the noise suppression filter values 364. The second time-frequency converter 320b provides a time domain representation of the noise suppression filter values 464. Moreover, the apparatus 400 comprises a filter 410, which is adjusted according to the time domain representation of the noise suppression filter values 464.

The filter 410 is configured to perform a time domain convolution of the audio signal 110 and the time domain representation of the noise suppression filter values 464. Similar to the apparatus 300, the apparatus 400 offers the possibility to apply voice activity detection 340 in the audio signal analyzer based on the audio signal 110 before filtering with the filter 410 or after filtering with the filter 410, indicated by the switch 320c. In addition, the gain value can be applied to the audio signal before filtering with the filter 410 or after filtering with the filter 410, indicated by the switches 330a and 330b. The apparatus 400 offers through its time domain based filtering, a lower delay when compared to a frame-wise processing in the frequency domain as described for apparatus 300.

Figure 5:
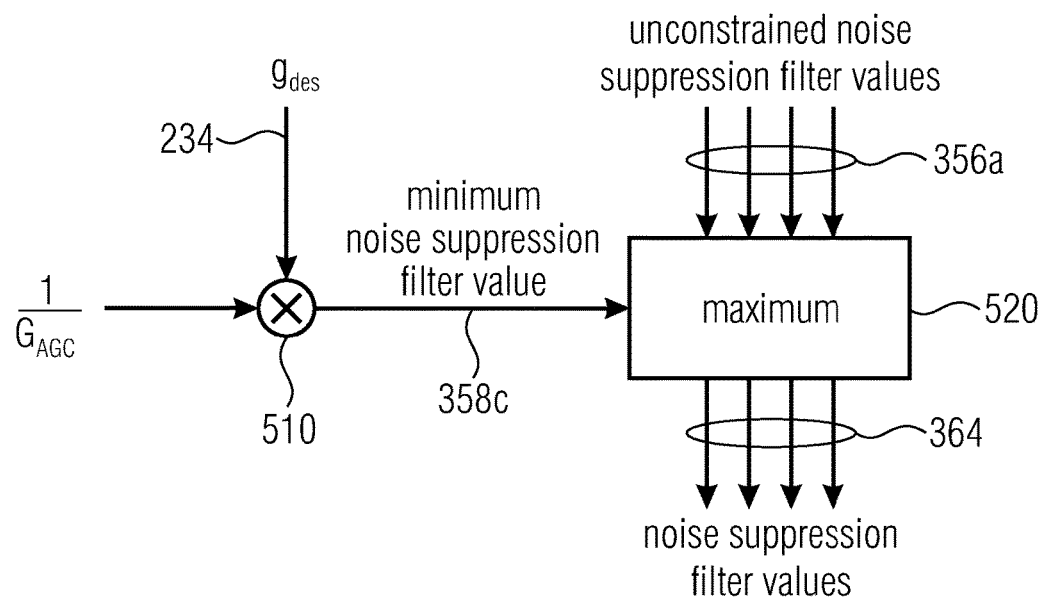
FIG. 5 shows a block diagram of the filter value selection stage of the audio signal analyzer according to FIG. 2.

FIG. 5 illustrates the noise suppression filter value determination of the audio signal analyzer 130. In a first step 510 a quotient between the predetermined noise suppression value $g_{des}$ 234 and the gain value $G_{AGC}(m)$ is computed, thereby determining the minimum noise suppression filter value 358c. In a next step 520, the unconstrained noise suppression filter values $H_{NR}(m, k)$ 356a are each compared to the minimum noise suppression value, so that values of the unconstrained noise suppression filter values 356a that are smaller than the minimum noise suppression filter value 358c are set to the minimum noise suppression filter value 358c. This can be described by:

$$\tilde{G}_{NR}(m, k; G_{AGC}) = \max\left\{H_{NR}(m, k); \frac{g_{des}}{G_{AGC}(m)}\right\}$$

thereby, the noise suppression filter values 364 are obtained. The described lower bounding of the noise suppression filter values can be advantageous in avoiding distortions due to too aggressive noise reduction.

Figure 6:
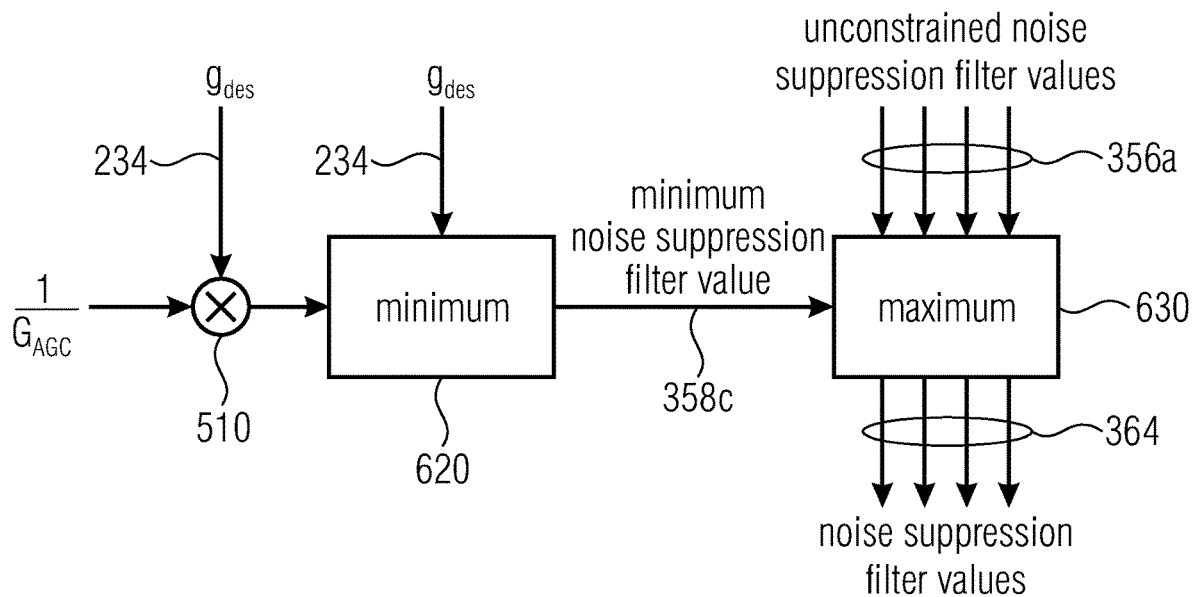
FIG. 6 shows a block diagram of the filter value selection stage of the audio signal analyzer according to FIG. 2.

FIG. 6 illustrates the noise suppression filter value selection in the audio signal analyzer 130 according to an advantageous embodiment of the invention. In a first step 510, a quotient between the predetermined noise suppression value 234 and the gain value is computed. In a next step, a minimum decision 620 is made between the quotient of the predetermined noise suppression value 234 and the gain value, and the predetermined noise suppression value 234. Thereby, a large minimum noise suppression filter value 358c can be avoided when the gain value is small, due to the minimum decision upper bounding the minimum noise suppression filter value 358c to the predetermined noise suppression value 234. In other words, a minimum noise suppression filter value 358c is obtained which is upper bounded by the predetermined noise suppression value 234. The selection of the minimum noise suppression filter value 358c can be summarized in the following equation:

$$\tilde{g}_{lim}^{[UC]}(m; G_{AGC}) = \min\left\{g_{des}; \frac{g_{des}}{G_{AGC}(m)}\right\}.$$

In a final step, the minimum noise suppression filter value 358c is compared to the unconstrained noise suppression filter values 356a so that based on a maximum decision 630, noise suppression filter values 364 are obtained which are lower bounded by the minimum noise suppression filter value 358c. The described estimation ensures noise suppression although a small gain value $G_{AGC}(m)$ is provided, thereby a noise reduction is obtained beyond the overall signal attenuation, achieved by the small gain value.

Figure 7:
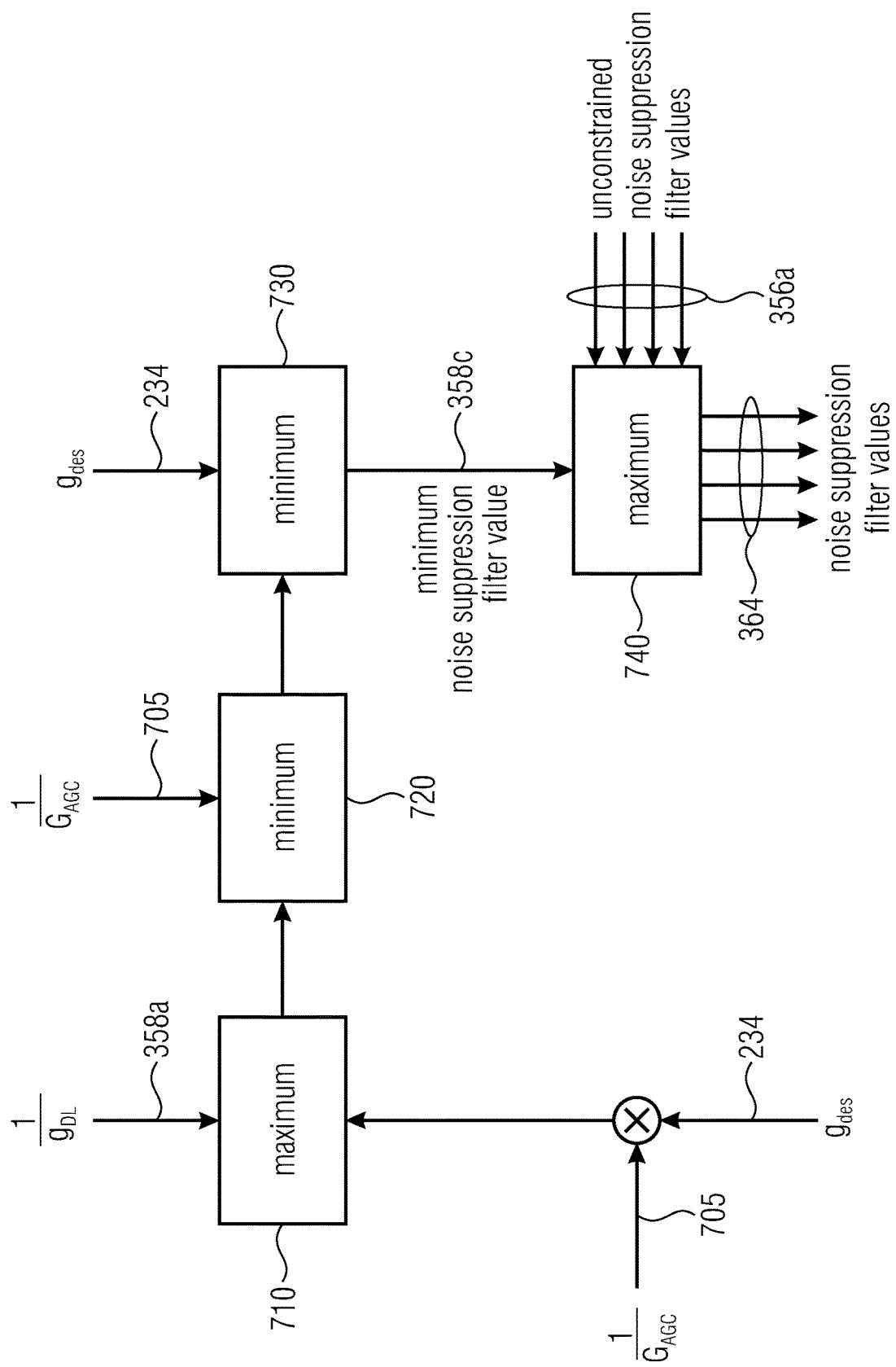
FIG. 7 shows a block diagram of the filter value selection stage of the audio signal analyzer according to FIG. 2.

In FIG. 7 a minimum noise suppression filter value determination is described as performed in the audio signal analyzer 130 according to an advantageous embodiment of the invention. In a first step, a quotient of the predetermined noise suppression value 234 and the gain value is computed. The quotient between the predetermined noise suppression value 234 and the gain value is subject to a first maximum decision 710 with an inverse of a predetermined distortion limit 358a. The result of the first maximum decision 710 is subject to a first minimum decision 720 with respect to an inverse of the gain value 705. Furthermore, the result of the first minimum 720 decision is subject to a second minimum decision 730 with respect to the predetermined noise suppression 234 value. Thereby, the minimum noise suppression filter value 358c is obtained as the result of the second minimum decision 730. This procedure yields the so-called distortion constrained minimum noise suppression filter value, e.g. distortion constrained noise attenuation limit. To better understand the meaning of the constraint, it can be reformulated as follows:

$$\tilde{g}_{lim}^{[DC]}(m; G_{AGC}) = \begin{cases} g_{des} & \text{if } 0 < G_{AGC}(m) \le 1 \\ g_{des}/G_{AGC}(m) & \text{if } 1 < G_{AGC}(m) \le g_{des} \times g_{DL} \\ 1/g_{DL} & \text{if } g_{des} \times g_{DL} < G_{AGC}(m) \le g_{DL} \\ 1/G_{AGC}(m) & \text{otherwise} \end{cases}.$$

Figure 11:
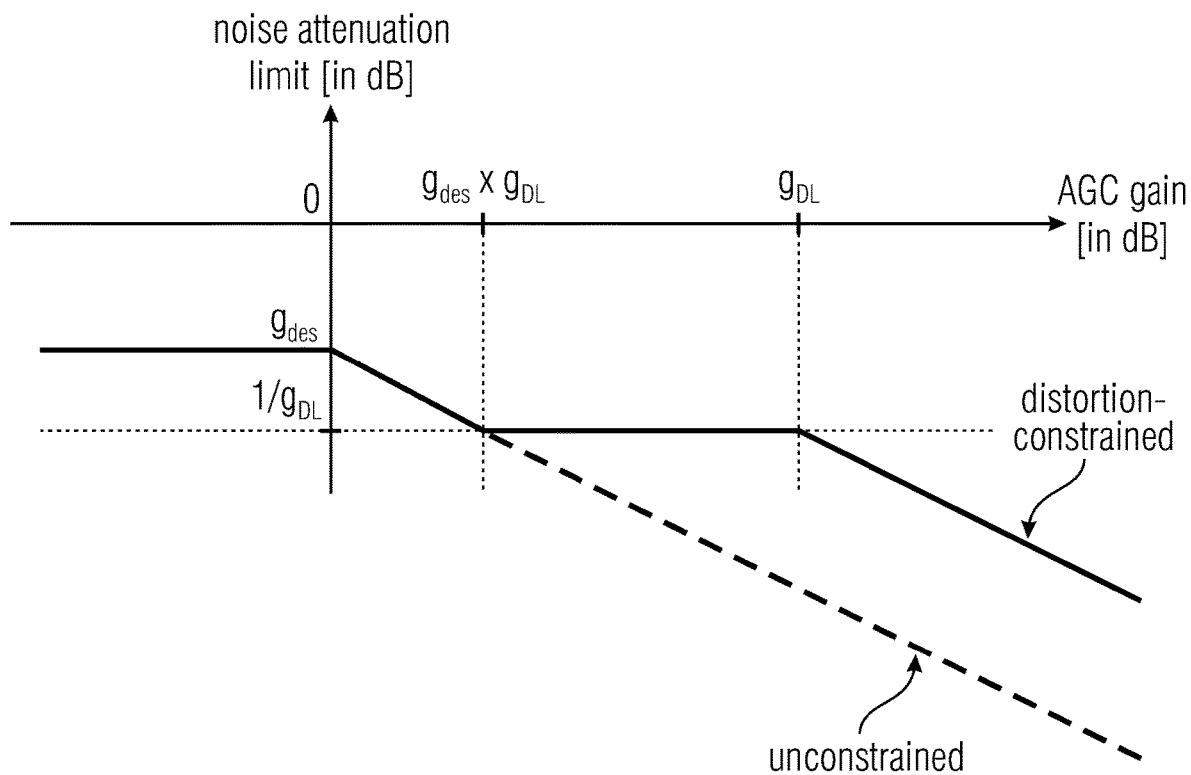
FIG. 11 shows a diagram of the minimum noise suppression filter value in dependence on a gain value.

The update rule for the noise attenuation limit computed as described above, can be formulated equivalently as $$\tilde{g}_{lim}^{[DC]}(m; G_{AGC}) = \min\left\{g_{des}; \min\left\{\frac{1}{G_{AGC}(m)}; \max\left\{\frac{1}{g_{DL}}; \frac{g_{des}}{G_{AGC}(m)}\right\}\right\}\right\},$$

and is illustrated in the graph in FIG. 11 with the solid line labeled as "Distortion-constrained".

In a second maximum decision 740, the minimum noise suppression filter value 358c is compared to each individual unconstrained noise suppression filter value 356a, so that unconstrained noise suppression values smaller than the minimum noise suppression filter value 358c are set to the minimum noise suppression filter value 358c, thereby obtaining the noise suppression filter values 364. The noise suppression filter value determination as described above is beneficial for avoiding signal distortions due to aggressive noise reduction.

Figure 8:
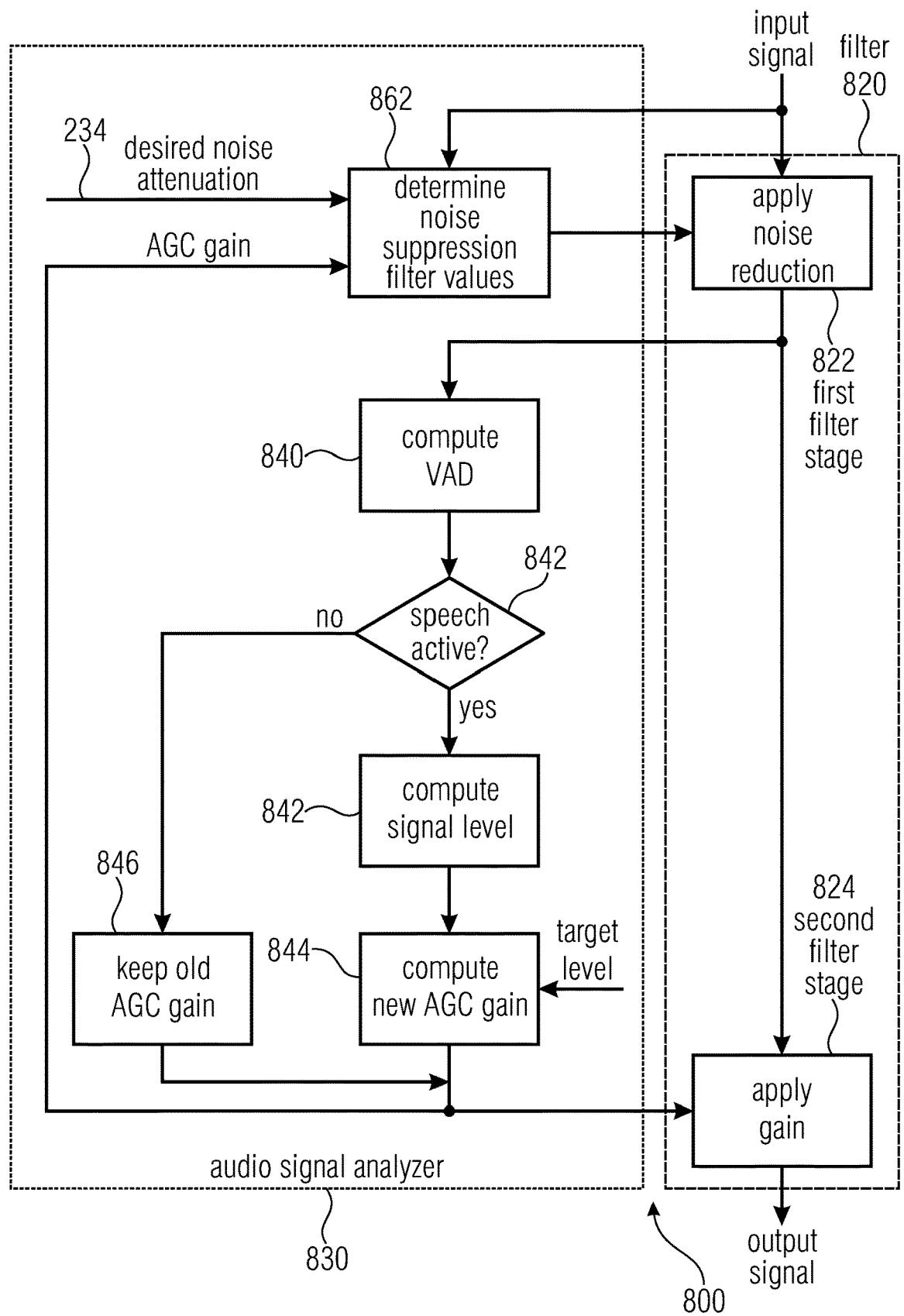
FIG. 8 shows a block diagram of an advantageous embodiment according to the invention.

FIG. 8 illustrates a block diagram of an apparatus 800 according to an advantageous embodiment of the invention, offering joint NR/AGC processing with automatic gain control of the unconstrained noise attenuation limit $\tilde{g}_{lim}^{[UC]}(m; G_{AGC})$.

The apparatus 800 comprises an audio signal analyzer 830 and a filter 820. Furthermore, an input signal is provided to the filter 820 and processed by a first filter stage 822 to apply noise reduction. Moreover, the output of the first filter stage 822 is provided to the audio signal analyzer 830 and a second filter stage 824 of the filter 820, wherein a gain value is applied.

Furthermore, the filter provides an output signal. The output signal of the first filter stage 822 is used in the audio signal analyzer 830 to compute a voice activity detection 840. Based on the result of the voice activity detection 840 a decision 842 is made to either forward a signal to compute a signal level 842, as a characteristic of the audio signal, which is used to compute a new AGC gain 844 based on the signal level and a target level, or to keep an old AGC gain 846. The decision on whether to compute a new gain or keep an old gain is based on a speech presence in the signal provided to the voice activated detector 840.

The determined gain value is then provided to the second filter stage 840 where it is applied to the signal. Furthermore, the gain value is used in the audio signal analyzer 830 for computing an unconstrained noise attenuation limit, i.e. a minimum noise suppression filter value, based on the gain value and a desired noise attenuation, i.e. a predetermined noise suppression value 234. In addition, using the unconstrained noise attenuation limit, the input signal and the AGC gain, the noise suppression filter values are determined 862 and provided to the first filter stage 822 of the filter 820.

Figure 17:
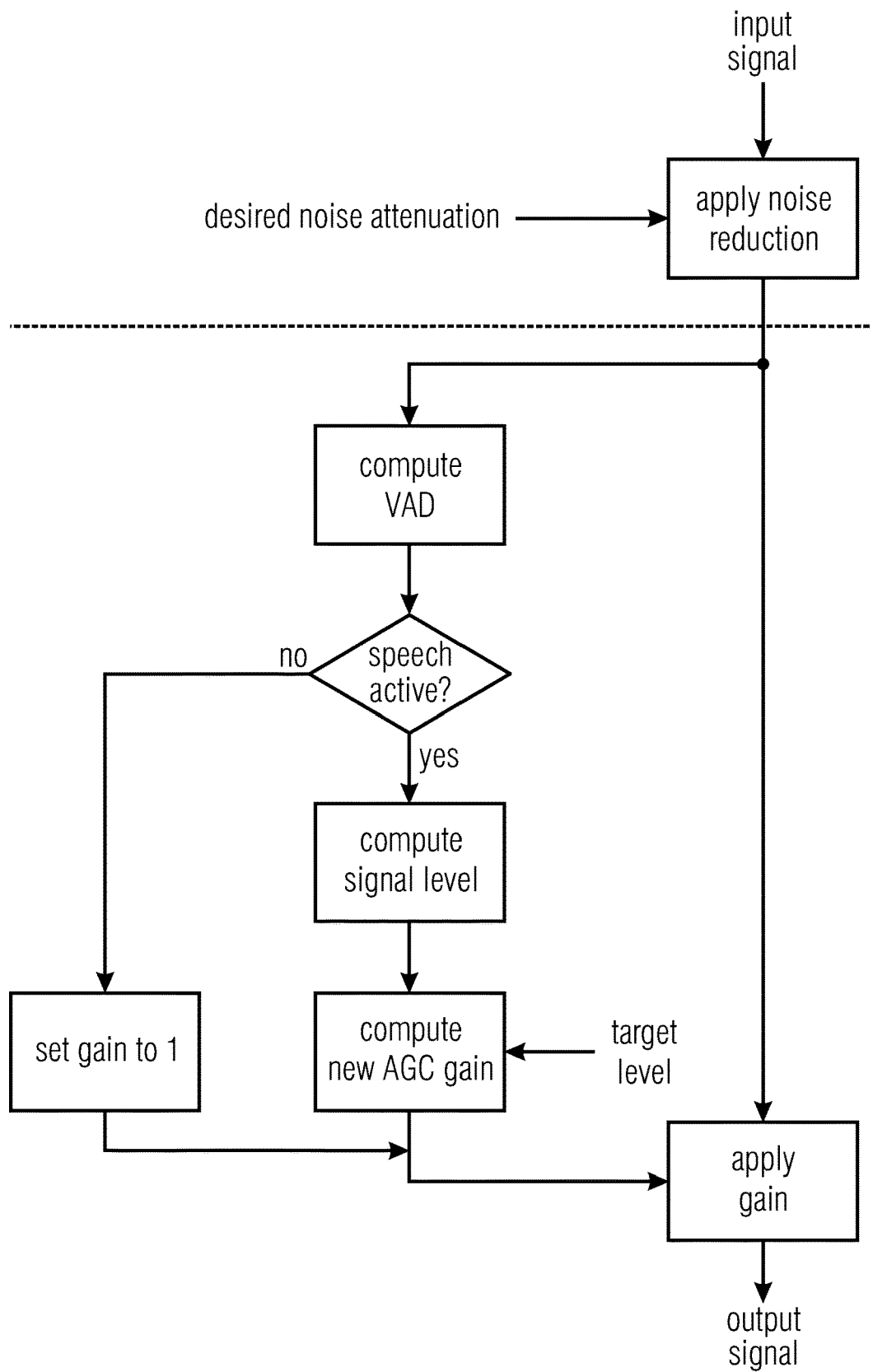
FIG. 17 shows a block diagram according to an aspect of the invention.

When the AGC triggers a signal amplification (rather than an attenuation), it is also possible to apply the AGC gain during speech periods only, similar to FIG. 17. The AGC gain is then temporarily decreased or directly set to unity during speech pauses. Since the AGC gain is taken into account in the computation of the noise attenuation limit $$\tilde{g}_{lim}^{[UC]}(m; G_{AGC}) = \min\left\{g_{des}; \frac{g_{des}}{G_{AGC}(m)}\right\},$$

it is guaranteed that the noise pumping effect is avoided, even though the AGC gain strongly fluctuates. The described approach has the advantage of ensuring noise reduction even for large AGC gains. Moreover, the described approach avoids a noise pumping effect, from which other approaches suffer, which leads to a quick increase of the noise floor at speech onsets and a rapid decrease at speech offsets.

The estimation of the noise suppression filter values 862 can for example be performed according to FIG. 5 or as described in FIG. 6. The described apparatus 800 is suitable for achieving a predetermined noise suppression and amplifying or attenuating a signal as needed to increase intelligibility.

Figure 9:
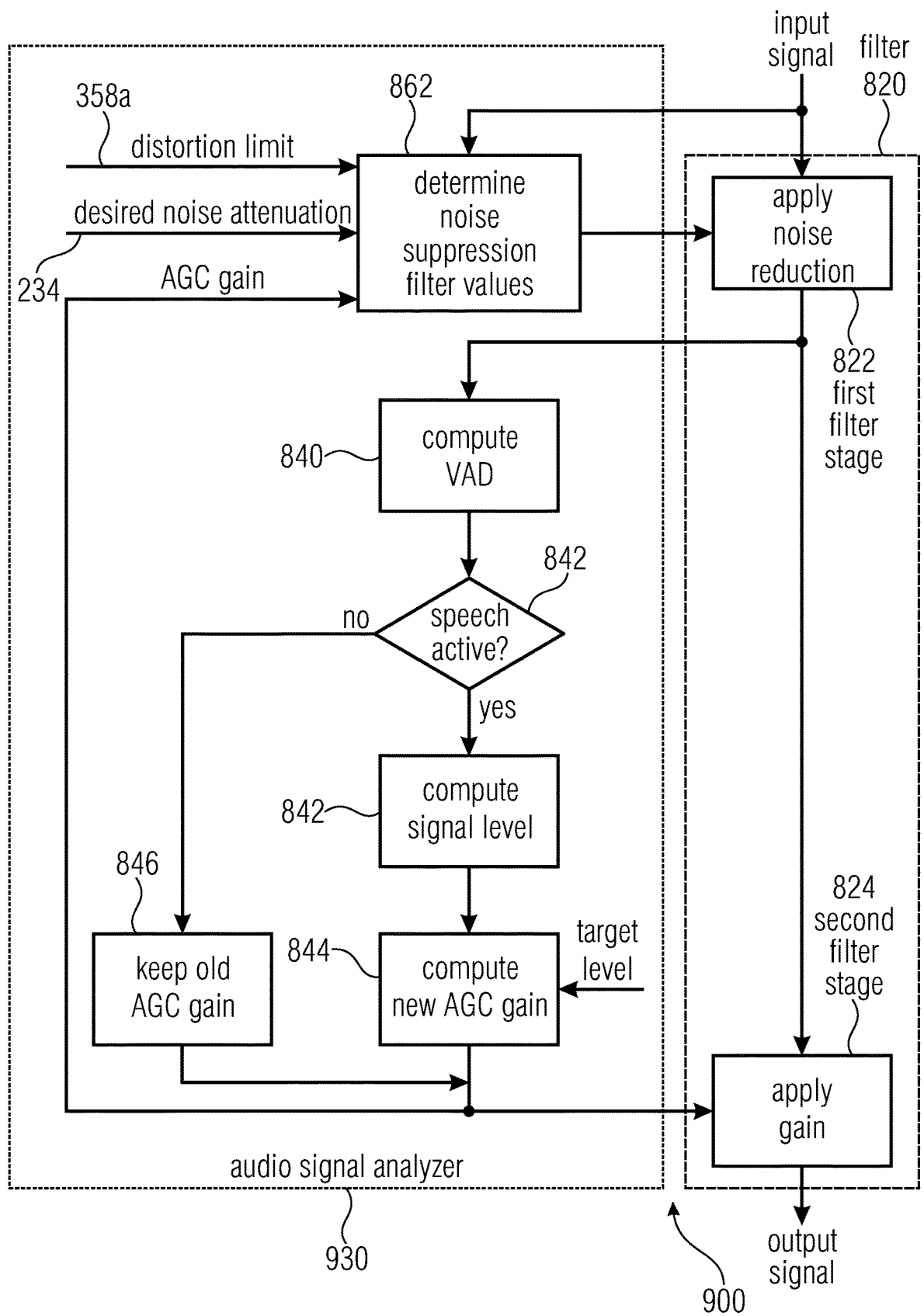
FIG. 9 shows a block diagram of an advantageous embodiment according to the invention.

FIG. 9 illustrates a block diagram of an apparatus 900 according to an advantageous embodiment of the invention, where joint NR and AGC processing with automatic control of the noise attenuation limit under a distortion constraint is performed. Alternatively, the computation of the AGC gain can be carried out based on the unprocessed audio input signal, i.e. before applying noise reduction. The apparatus 900 comprises much of the same functionality as the apparatus 800 in FIG. 8, but for estimation of the noise suppression filter values 862 an additional parameter is considered a distortion limit 358a, or more generally a predetermined distortion limit. The apparatus 900 is especially suitable for avoiding signal distortions like speech distortion or musical tones due to aggressive noise suppression introduced by a small minimum noise suppression value, potentially caused by a large AGC gain.

Figure 10:
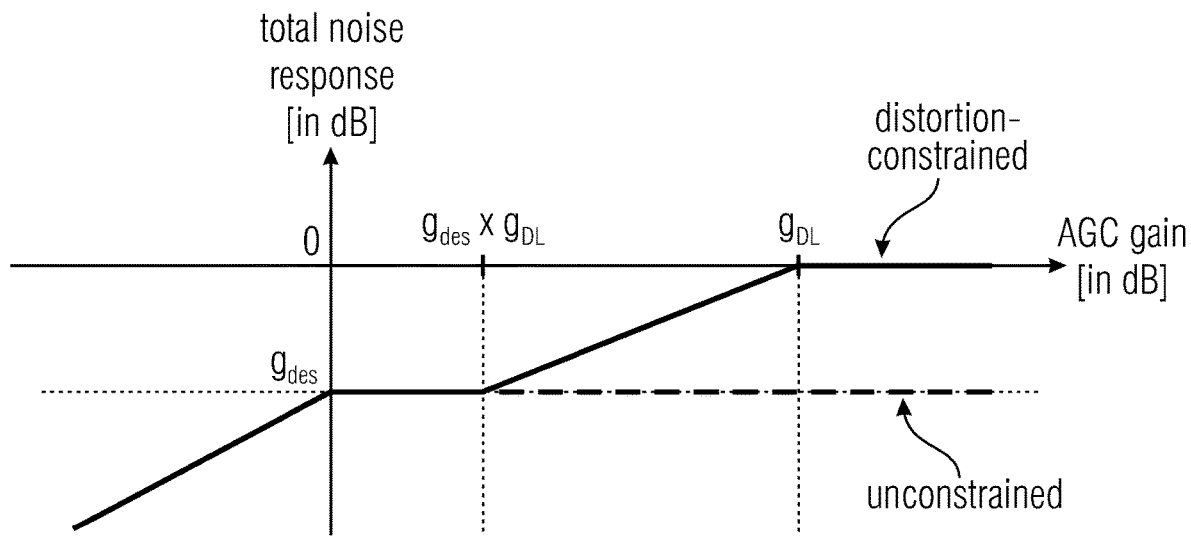
FIG. 10 shows a diagram of an overall system response.

FIG. 10 shows a diagram of system responses when the input signal to the system is characterized primarily as noise. In other words, the total noise response as a function of the AGC gain when applying NR and AGC with constrained or unconstrained noise attenuation limit (solid and dashed lines, respectively) is shown.

The line labeled unconstrained relates for example to the advantageous embodiment as described in apparatus 800 as an advantageous embodiment of the invention as described in FIG. 8. Furthermore, the line distortion-constrained relates for example to apparatus 900 as an advantageous embodiment of the invention as described in FIG. 9. The system responses in FIG. 10 are displayed in logarithmic values in dependence on a gain value given in logarithmic values. FIG. 10 shows that for low gain values (gain values smaller than 0 dB) actually an attenuation is realized for the overall system response, due to the joint noise reduction and gain control. When the gain value is between 0 dB and the product of the predetermined noise suppression value and the distortion limit, a constant noise suppression is realized by the unconstrained and distortion-constrained apparatuses equally, for example apparatus 800 and apparatus 900, respectively. When the gain value is between the product of the predetermined noise suppression value and the predetermined distortion limit, and the predetermined distortion limit, the overall system response of the distortion-constrained graph increases to 0 dB, for example linearly. Furthermore, the "unconstrained" labeled graph remains constant at the value of the predetermined noise suppression value, when the gain value is between the product of the predetermined noise suppression value and the predetermined distortion limit, and the distortion limit. Moreover, the graph labeled "distortion-constrained" remains constant, for gain values larger than the predetermined distortion limit, at 0 dB. Furthermore, the graph labeled "unconstrained" remains constant at the value of the predetermined noise suppression value, for gain values greater than the predetermined distortion limit. In other words, for the distortion-constrained case the overall system response, for an audio signal primarily characterized as noise, can be written as:

$$G_{NR+AGC}^{[DC]}(m, k)|_{SNR \approx 0} = \begin{cases} G_{AGC}(m) \times g_{des} & \text{if } 0 < G_{AGC}(m) \leq 1 \\ g_{des} & \text{if } 1 < G_{AGC}(m) \leq g_{des} \times g_{DL} \\ G_{AGC}(m)/g_{DL} & \text{if } g_{des} \times g_{DL} < G_{AGC}(m) \leq g_{DL} \\ 1 & \text{otherwise} \end{cases}.$$

In summary, FIG. 10 describes with the graph labeled "unconstrained", relating for example to apparatus 800, and with the graph labeled "distortion-constrained", relating for example to apparatus 900, that noise is not amplified by both apparatuses in situations where the input signal is only characterized by noise. Thereby, an uncomfortable noise amplification can be avoided.

FIG. 11 illustrates a graph with two lines, one labeled "unconstrained" and another labeled "distortion-constrained", which relate to the minimum noise suppression filter value as described in FIG. 6 or FIG. 7, respectively. In other words, a noise attenuation limit as a function of the AGC gain for the constrained and unconstrained cases (solid and dashed lines, respectively), is shown.

The minimum noise suppression filter value can for example be a noise attenuation limit, given here in logarithmic values. Furthermore, the graphs are depicted in dependence on the gain value in logarithmic values. The graph labeled "unconstrained" is constant at the predetermined noise suppression value for gain values smaller than 0. Moreover, the graph labeled "unconstrained" decreases for gain values greater than 0 dB, for example linearly. Moreover, the graph labeled "distortion-constrained" is constant at a value of the predetermined noise suppression value for gain values smaller than 0 dB, and decreases, for example linearly, for gain values greater than 0 dB and smaller than the product of the predetermined noise suppression value and the predetermined distortion limit, from the predetermined noise suppression value to the inverse of the predetermined distortion limit. Furthermore, the graph labeled "distortion-constrained" remains constant at a value of the inverse of the predetermined distortion limit value, for gain values between the product of the predetermined noise suppression value and the predetermined distortion limit, and the predetermined distortion limit. In addition, the graph labeled "distortion-constrained" decreases, for example linearly, for gain values greater than the predetermined distortion limit value. For the distortion constrained case, this can be described equivalently as:

$$\tilde{g}_{lim}^{[DC]}(m; G_{AGC}) = \begin{cases} g_{des} & \text{if } 0 < G_{AGC}(m) \leq 1 \\ g_{des}/G_{AGC}(m) & \text{if } 1 < G_{AGC}(m) \leq g_{des} \times g_{DL} \\ 1/g_{DL} & \text{if } g_{des} \times g_{DL} < G_{AGC}(m) \leq g_{DL} \\ 1/G_{AGC}(m) & \text{otherwise} \end{cases}$$

For comparison, the unconstrained case and the constrained case are shown as a dashed and a solid line, respectively. It can be observed that the distortion-constrained noise attenuation limit behaves like its unconstrained counterpart for low to moderate AGC gains $G_{AGC}(m) \leq g_{des} \times g_{DL}$. As the AGC gain increases, $\tilde{g}_{lim}^{[DC]}(m; G_{AGC})$ decreases down to $1/g_{DL}$ and remains at this level as long as $G_{AGC}(m) \leq g_{DL}$. Therefore the distortion constraint is met for AGC gains up to the distortion limit $g_{DL}$ only. Above that, the noise reduction limit starts again to decrease. This is to ensure that the noise is not amplified at the output compared to the input, which becomes apparent if we derive the overall system response $G_{NR+AGC}^{[DC]}(m, k)$ depicted in FIG. 10 for noise segments characterized by a low SNR. In this case, we can assume that the NR filter $\tilde{G}_{NR}^{[DC]}(m, k; G_{AGC})$ reaches its minimum $\tilde{g}_{lim}^{[DC]}(m; G_{AGC})$. Hence, the total noise response can be written as:

$$G_{NR+AGC}^{[DC]}(m, k)|_{SNR\approx 0} = \begin{cases} G_{AGC}(m) \times g_{des} & \text{if } 0 < G_{AGC}(m) \leq 1 \\ g_{des} & \text{if } 1 < G_{AGC}(m) \leq g_{des} \times g_{DL} \\ G_{AGC}(m)/g_{DL} & \text{if } g_{des} \times g_{DL} < G_{AGC}(m) \leq g_{DL} \\ 1 & \text{otherwise} \end{cases}$$

where it is visible that the total noise response increases for increasing AGC gains, but it remains below one to ensure that the noise is not amplified. The total noise response is represented as a function of the AGC gain in FIG. 10 as a solid line. The unconstrained noise response is shown as a dashed line for comparison in FIG. 10.

FIG. 11 illustrates an advantageous dependence of the minimum noise suppression filter value on the gain value to enable a flexible noise reduction according to an applied (AGC) gain. Furthermore, the graph labeled "distortion-constrained" and the graph labeled "unconstrained" exhibit the ability to keep the minimum noise suppression filter value substantially above 0, therefore avoiding signal distortions.

Figure 12:
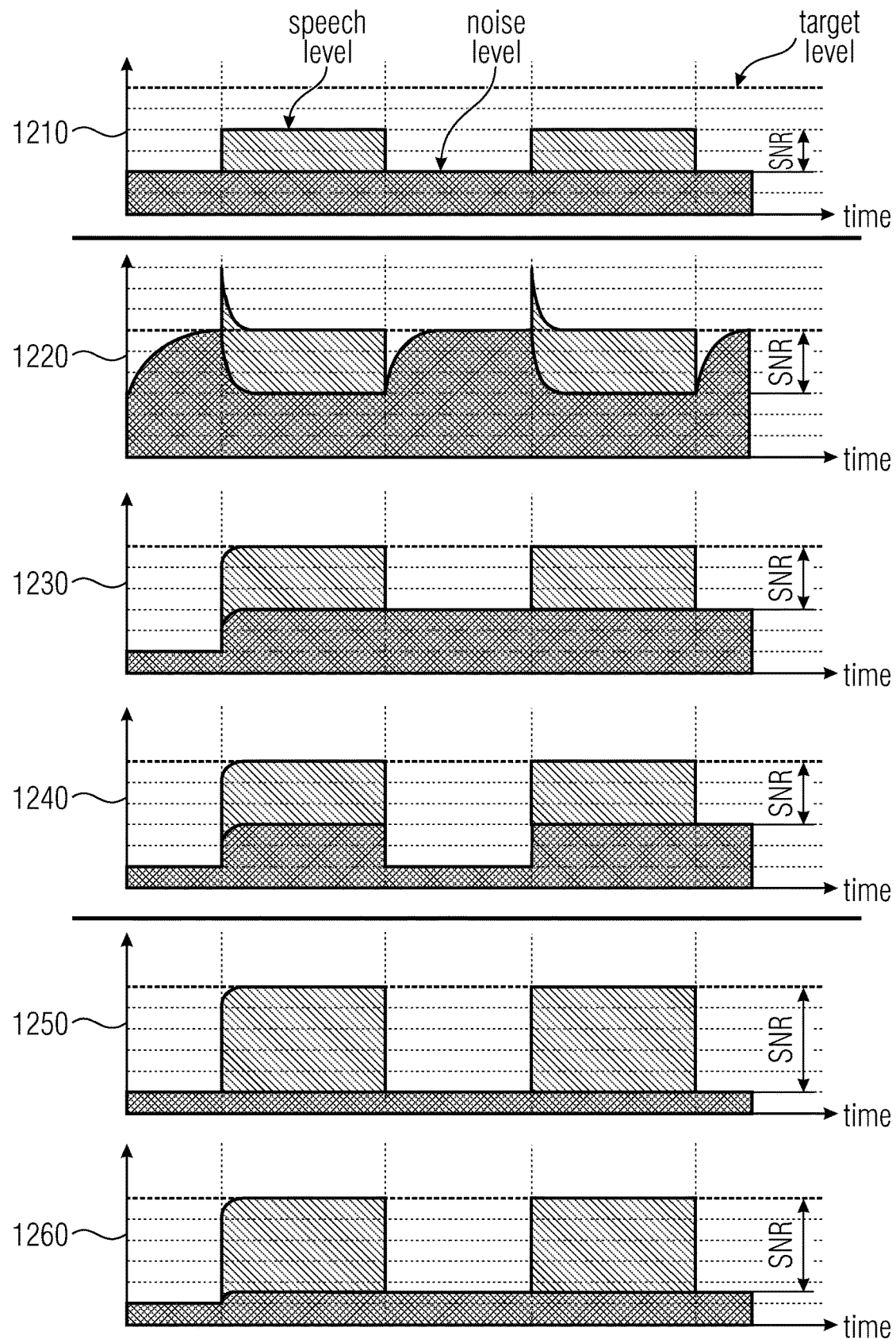
FIG. 12 shows graphs of a signal before and after signal processing.

FIG. 12 illustrates signal levels after various processing for example with the apparatuses 100, 300, 400, 800 or 900. Moreover, speech and noise levels before NR+AGC (1210) and after NR/AGC processing (1220, 1230, 1240, 1250, 1260) are depicted.

Graph 1210 is an illustrative example of an audio signal, describing for example the audio signal 110. Furthermore, graph 1210 shows a constant noise level over time and two phases in which speech is active. The speech, when active, has a higher signal level than the noise, resulting in a positive signal-to-noise ratio (SNR). In addition, graph 1210 shows a dashed line labeled target level, to which for example a speech signal is supposed to be adjusted to enable a comfortable listening experience.

Graph 1220 shows the signal as displayed in graph 1210 after being processed by some noise reduction and gain control, for example some basic automatic gain control scheme. A higher SNR is obtained in periods of speech activity. In addition, the noise level is also amplified towards the target level, resulting in an uncomfortable noise amplification.

Graph 1230 displays the output levels of a signal, for example a signal as described in graph 1210 after processing, where for example for the processing an automatic gain control exploits a voice activity detection to assist the automatic gain control update. Therefore, in the first time interval the noise level is not amplified towards the target level, an amplification only starts after speech activity is detected.

Graph 1240 shows the output levels of a signal, for example the input signal as described in graph 1210, after signal processing, where the processing for example comprises a noise reduction and an automatic gain control, wherein the automatic gain control exploits a voice activity detection to apply the automatic gain control on speech only phases.

Graph 1250 shows output levels of an input signal, for example as depicted in graph 1210, after signal processing, where the signal processing for example comprises unconstrained noise reduction and automatic gain control as described for example in FIG. 8 for apparatus 800. Thereby, a large increase in SNR is observable in phases of speech activity. Furthermore, the noise level is at a substantially constant level and reduced when compared to graph 1210.

Graph 1260 shows output levels, for example of an input signal as depicted in graph 1210 after signal processing, wherein the signal processing comprises joint noise reduction automatic gain control under a distortion constraint as described for example in FIG. 9 for apparatus 900. A large signal-to-noise ratio increase compared to graph 1210 can be obtained. Furthermore, the noise level is at a substantially constant level. Moreover, a distortion constraint avoids uncomfortable signal distortions in the output of the processing.

Figure 13:
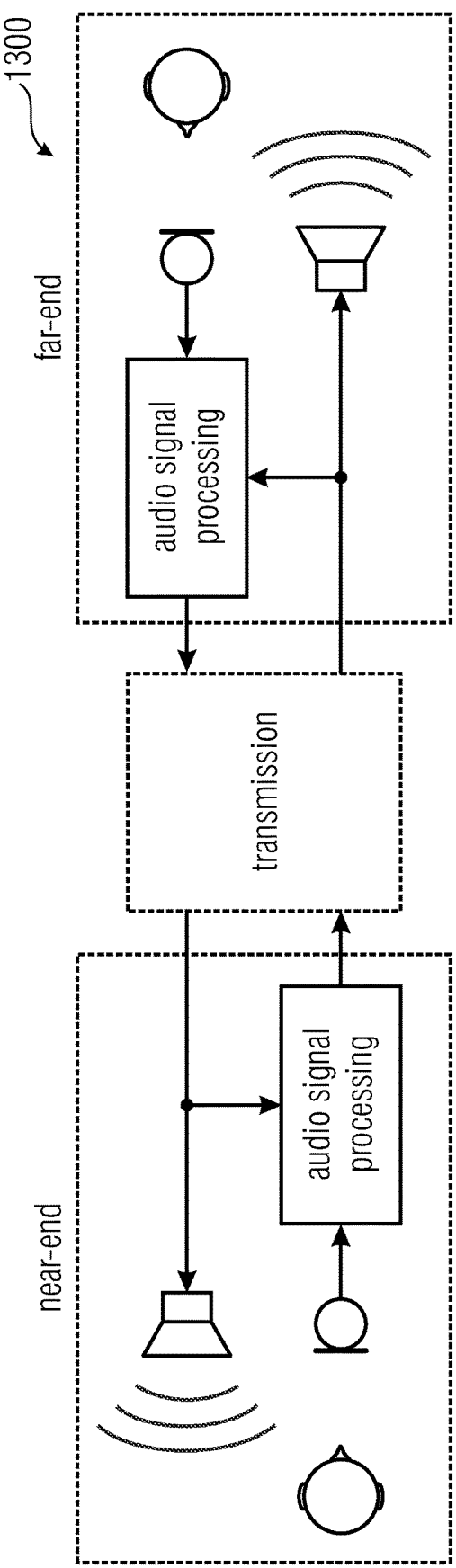
FIG. 13 shows a block diagram of a full-duplex speech communication scenario.

FIG. 13 illustrates a block diagram of a two-way, full-duplex speech communication system 1300 according to an advantageous embodiment of the invention. The system comprises a near-end and a far-end side, and a transmission in between. Furthermore, the near-end side and the far-end side each comprise a loudspeaker and a microphone, as well as an audio signal processing unit, wherein the audio signal processing unit can comprise one of the apparatuses 100, 300, 400, 800, 900.

On the near-end side a person speaks into the microphone and receives audio information through the loudspeaker. Additionally, on the far-end side another person speaks into the microphone and receives audio information transmitted from the near-end side through the loudspeaker, potentially concurrently since it is a full-duplex system. The system 1300 facilitates a comfortable listening experience and improves speech intelligibility of a speech communication taking place between the near-end and far-end sides. Especially, for a hands-free scenario, where the distance between a user and the microphone can vary, the described embodiment can be suitable to improve intelligibility.

Figure 14:
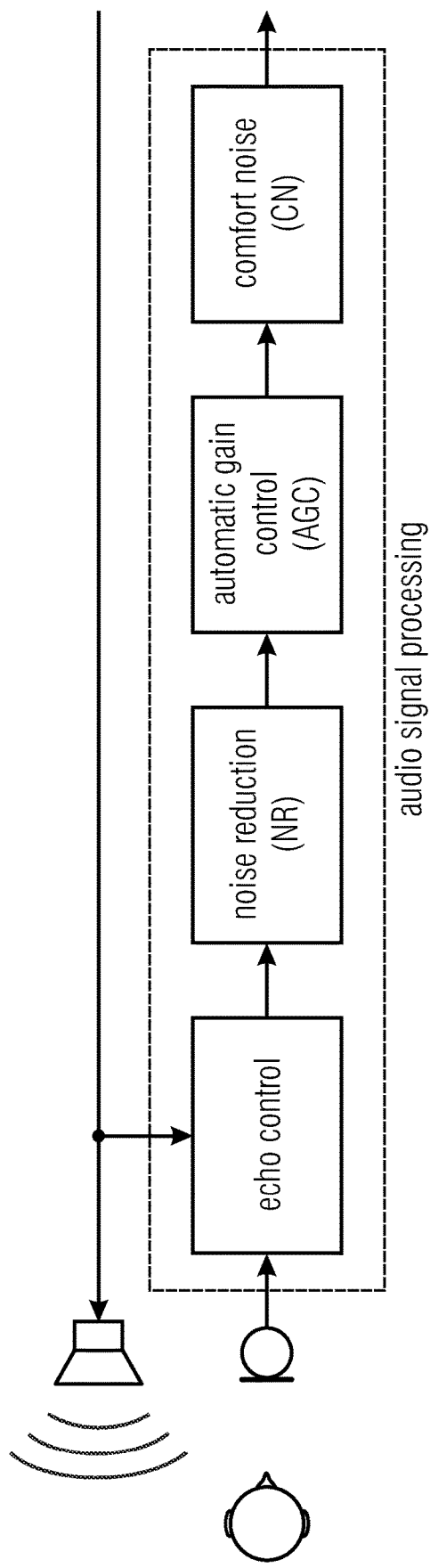
FIG. 14 shows a block diagram of the receiver or the transmitter side of a full-duplex speech communication scenario.

FIG. 14 illustrates a block diagram of a signal processing chain that can be employed as a near-end or far-end side of a speech communication system, e.g. the speech communication system 1300.

Figure 15:
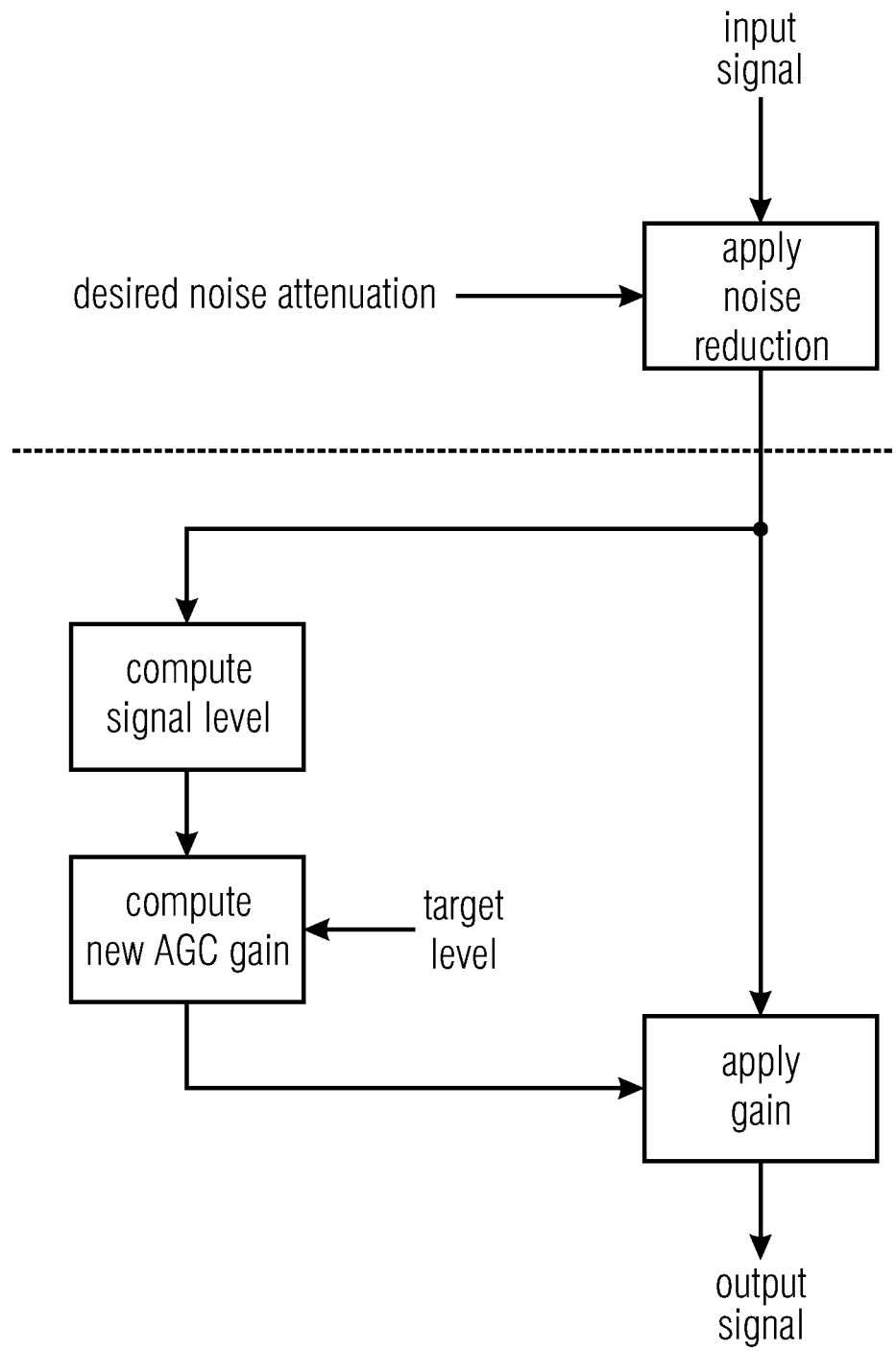
FIG. 15 shows a block diagram according to an aspect of the invention.

FIG. 15 illustrates a block diagram of a signal processing chain, it shows a basic configuration of applying NR and AGC processing independently. First an input signal is subject to a noise reduction which is based on a predetermined noise suppression value, here, a desired noise attenuation, the resulting signal after noise reduction is used to compute a signal level and to compute a gain value, for example an automatic gain control gain, based on a computed signal level and a predetermined target level. In a next step, the computed gain value, for example, the computed AGC gain, is applied to the signal after noise reduction is performed.

Automatic gain control can be applied at the output of the noise reduction module for example on a frame-by-frame basis using the three-step procedure depicted in FIG. 15 and detailed below:

1. Level computation: The signal level, denoted by L(m), is computed at the AGC input (here the noise reduction (NR) output). A measure for the signal level can be a mere variance. Alternatively, spectral weighting can be applied to mimic the human auditory system, yielding a measure of the perceived loudness.
2. Gain computation: A scalar gain is derived by comparing the current input signal level, denoted by L(m), with a pre-defined target speech level $L_{tar}$, as described for apparatuses 300 and 400 as target value. This can be achieved as follows:

$$G_{AGC}(m) = \beta \, G_{AGC}(m-1) + (1 - \beta)\frac{L_{tar}}{L(m)}, \quad (6)$$

where $G_{AGC}(m)$ is the AGC gain computed at frame m and β is a forgetting factor used to temporally smooth the AGC gain (with 0≤β<1).

3. Gain multiplication: The last step comprises a multiplication of the input signal with the AGC gain. This can be done equivalently either in the time domain or in the frequency domain.

The above procedure results in an amplification of the input audio signal when the AGC input level L(m) is below the target level $L_{tar}$. In contrast, some attenuation is applied when the signal level L(m) is above the target level $L_{tar}$. Hence the AGC gain is automatically adjusted over time and is therefore time varying. Furthermore, the described gain computation can be in part or completely used in the according modules of the described apparatuses 300, 400, 800 and 900. Moreover, for usage in the mentioned apparatuses modifications to the described methods can also be applied, for example based on employing a voice activity detection. Furthermore, note the absence of interaction between the AGC and NR modules, which is emphasized by the dashed horizontal line in FIG. 15.

When, for instance, the background noise level after NR filtering is lower than the speech level, the drawback of this approach is that it causes a decrease of the measured level L(m) at the AGC input, which in turn causes an increase of the AGC gain during speech pauses, followed by a decrease of the AGC gain at the speech onsets. This phenomenon is illustrated in FIG. 12, where the graph 1210 shows the level of the speech and noise components in an input audio signal (before NR). Graph 1220 shows the speech and noise levels after applying NR and AGC according to the above procedure. Despite the constant speech and noise levels at the input, we see that this method produces a time-varying speech level, which is not the desired behavior for an AGC. Moreover, it produces a time-varying noise level, which results in a very unpleasant noise pumping effect in the output signal. To solve these problems, a Voice Activity Detection (VAD) is used, as explained for FIGS. 3, 4, 8, 9, 16 and 17.

Figure 16:
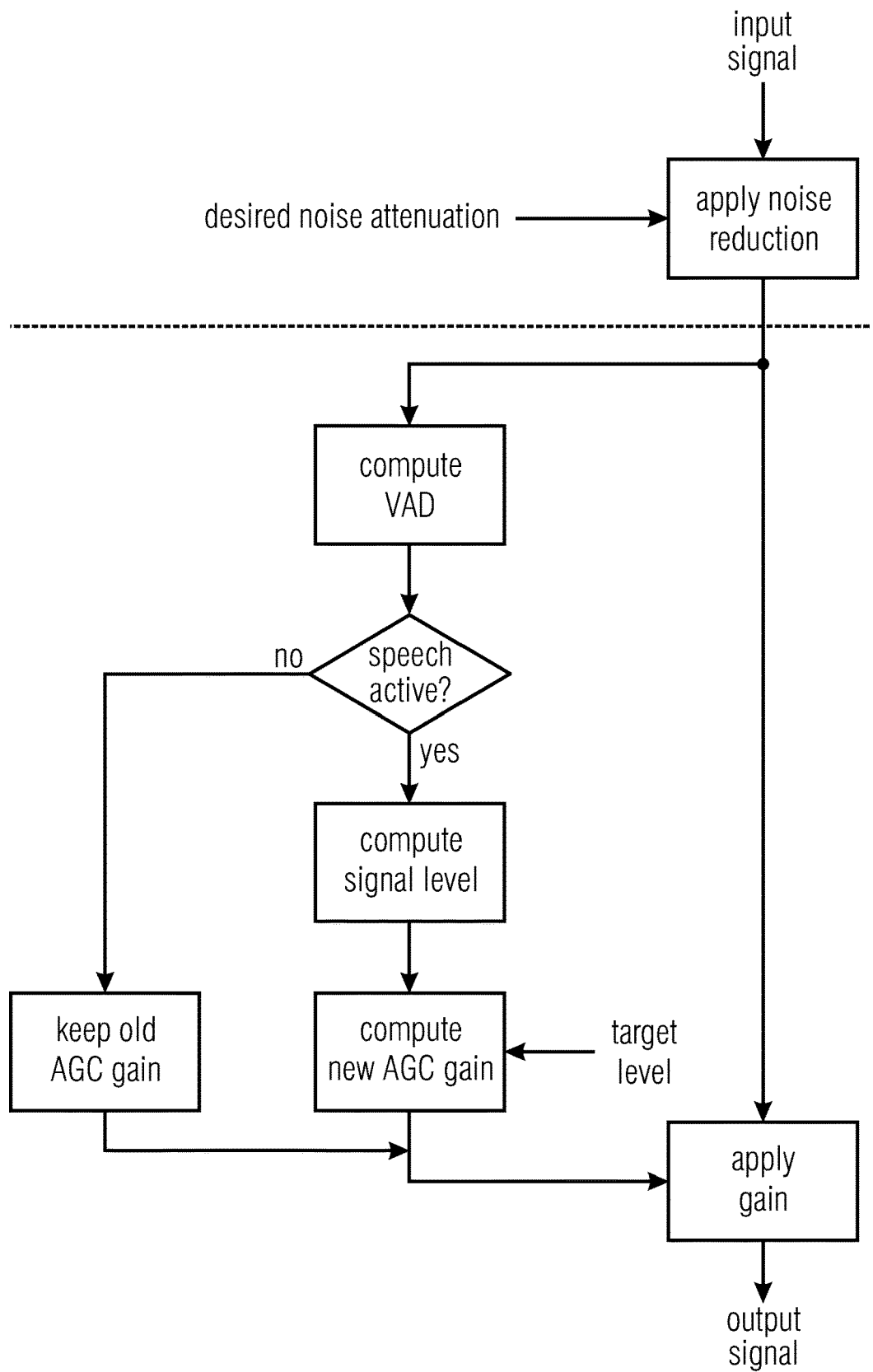
FIG. 16 shows a block diagram according to an aspect of the invention.

FIG. 16 illustrates a block diagram of an apparatus for processing a signal, it shows separate NR and AGC processing with voice activity detection triggering the gain update. In a first step, an input signal is subject to a noise reduction, which is based on a predetermined noise suppression value, for example a desired noise attenuation. In a next step, the input signal after being subject to noise reduction is used to compute a voice activity detection, on which a speech activity decision is based. When speech has been detected, a signal level is computed based on the input signal after noise reduction. In a further step, assuming speech activity, a gain value, for example a new automatic gain control gain, is determined based on the computed signal level and a predetermined target level. When no speech has been detected by the voice activity detection a gain value from a previous time instance is employed. In a final step, the gain value, either the gain value from a previous time instance or the gain value computed from the current time instance, is applied to the signal after noise reduction, thereby providing an output signal.

To avoid a noise pumping effect and provide a consistent speech level, a VAD(=Voice Activity Detection) can be applied to bypass the gain update during speech pauses, as shown in FIG. 16. Provided that speech activity can be detected reliably, the AGC gain can then be adjusted during active speech segments only, while keeping the AGC gain constant during speech pauses. As depicted in graph 1230, this method produces a consistent speech level and avoids the noise pumping effect (constant noise level after convergence). However, it can cause a significant increase of the absolute noise level for large AGC gains, which becomes especially noticeable during speech pauses in practice.

FIG. 17 illustrates a block diagram for signal processing which is analog to the block diagram described in FIG. 16 with separate NR and AGC processing with VAD triggering the entire AGC processing. Furthermore, the block diagram in FIG. 17 describes setting a gain value to 1 when no speech has been detected. To void noise amplification during speech pauses, as depicted in Graph 1230, the AGC gain is only applied during speech periods, as presented in FIG. 17 (applying unity during speech pauses is equivalent to not apply an AGC gain). This approach provides a low speech level and prevents amplification of the noise during speech pauses. However, it results again in a time-varying scaling of the noise (see graph 1240), which is perceived as an annoying noise pumping effect in practice.

Figure 18:
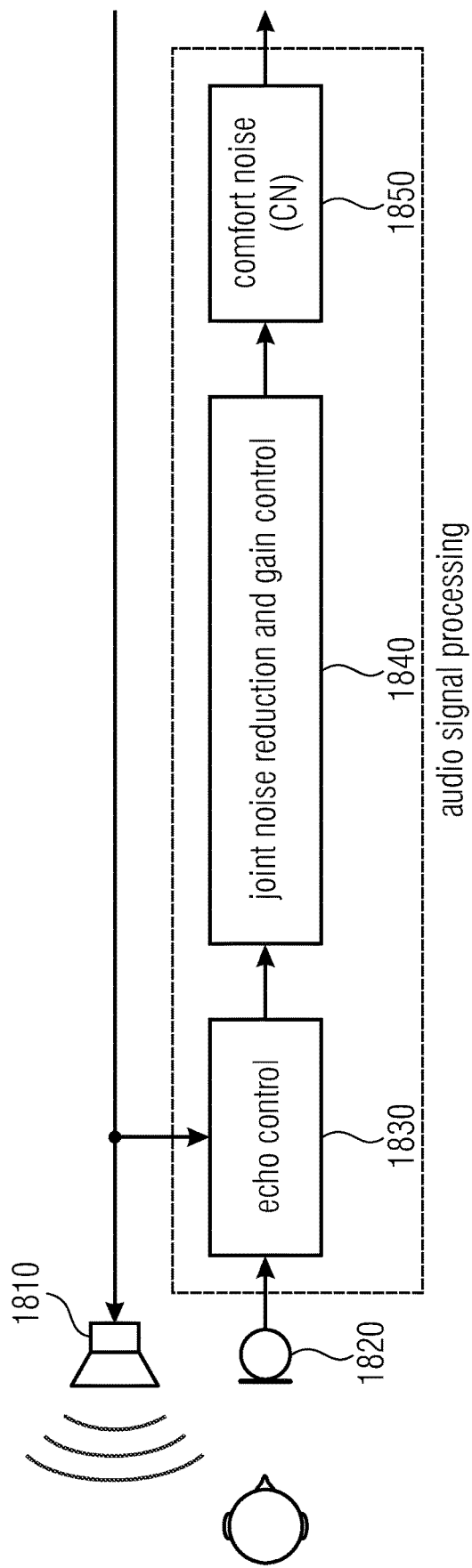
FIG. 18 shows a block diagram according to an advantageous embodiment according to the invention.

FIG. 18 illustrates a near-end or a far-end side of a communication system according to an advantageous embodiment of the invention, e.g. the speech communication system 1300 as described in FIG. 13. The far-end or the near-end side can be realized with a similar structure. Therefore, only one side is described but all functionalities can also be available on the other side.

The considered side comprises a loudspeaker 1810 for delivering audio content to a listener and a microphone 1820 to pick up a desired signal, e.g. a speech signal from an talking person. In addition, an echo control system 1830 suppresses echoes in the microphone signal based on the loudspeaker signal. After echo control 1830, a joint noise reduction and gain control 1840 processes the signal. The joint noise reduction and gain control 1840 can be realized for example by apparatuses 100, 300, 400, 800 and 900.

In addition, a comfort noise system 1850 applies a comfort noise to a signal after joint noise reduction and gain control 1840, to enable a comfortable listening experience to a user on the far-end, for example when no desired signal component is present in the acquired signal of the microphone (i.e. far-end only activity). In summary, the system described in FIG. 18 offers a signal processing so that a signal which is for example transmitted to a far-end side offers an intelligible speech component of the transmitted signal and a comfortable listening experience for a user on the far-end side.

Figure 19:
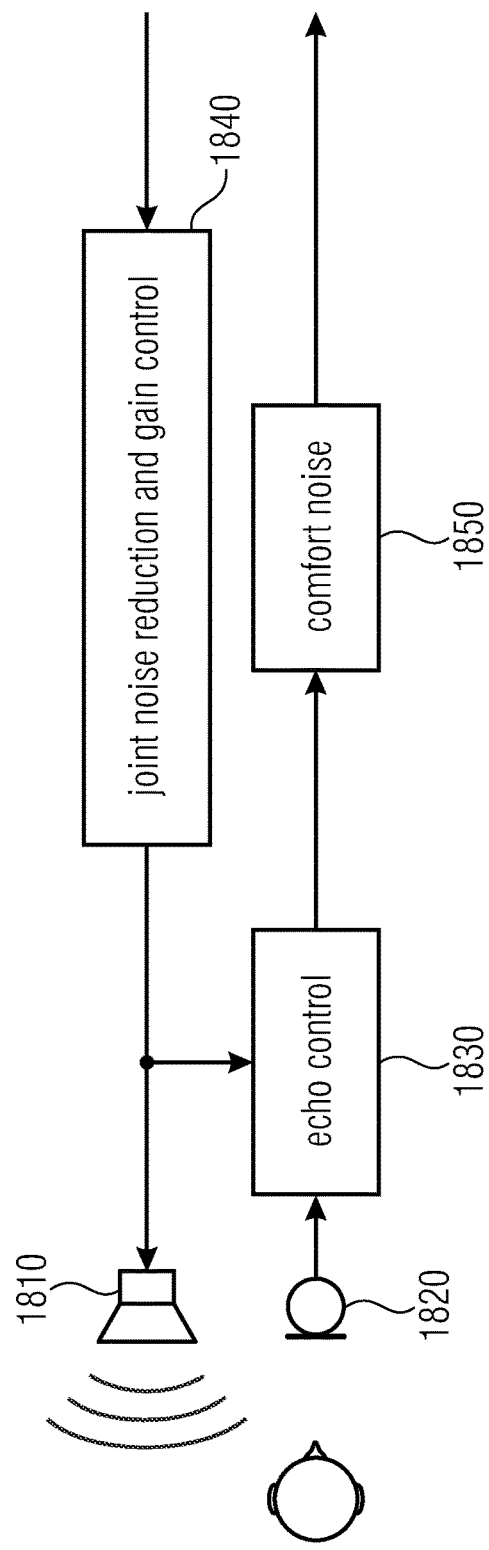
FIG. 19 shows a block diagram according to an advantageous embodiment according to the invention.

FIG. 19 illustrates a block diagram of a far-end side of a communication system according to an advantageous embodiment of the invention. The system in FIG. 19 comprises a loudspeaker 1810 configured to deliver audio content to a listener and a microphone 1820 configured to enable recording an audio signal which for example contains speech content. Furthermore, the system described in FIG. 19 comprises a joint noise reduction and gain control 1840 for the signal delivered to the loudspeaker 1810. In addition, the signal recorded by the microphone 1820 is subject to an echo control 1830 which is based on the signal delivered to the loudspeaker 1810 and a comfort noise system 1850. The echo control 1830 and comfort noise system 1850 comprise the same functionality as described in FIG. 18. Moreover, the joint noise reduction and gain control 1840 can for example be realized by apparatuses 100, 300, 400, 800 or 900. Thereby, the system described in FIG. 19 provides an intelligible speech signal when the audio signal delivered to the loudspeaker comprises a speech component. Furthermore, due to the noise reduction part a comfortable listening experience is realized.

Further embodiments rely on a processing of the audio signal in a sequence of frames. The audio signal analyzer (130; 830; 930) is configured to analyze the audio signal in the sequence of frames comprising a first frame and a second frame following the first frame in time, to determine, for the first frame, a first plurality of noise suppression values, and for the second frame, a second plurality of noise suppression values. The analyzer is configured to determine the first plurality of noise suppression filter values so that the noise suppression filter values of the first plurality of noise suppression filter values are greater than or equal to a first minimum noise suppression filter value (130b'; 240; 358c, 360a) determined for the first frame, and so that the first minimum noise suppression filter value depends on a first characteristic of the first frame of the audio signal (130c'). The analyzer is furthermore configured to determine the second plurality of noise suppression filter values so that the noise suppression filter values of the second plurality of noise suppression filter values are greater than or equal to a second minimum noise suppression filter value (130b'; 240; 358c, 360a) determined for the second frame, and so that the second minimum noise suppression filter value depends on a second characteristic of the second frame of the audio signal (130c'). The filter (120; 310; 410; 820) is configured for filtering the audio signal in the sequence of frames, wherein a first filter for the first frame is adjusted based on the first plurality of noise suppression values, and wherein a second filter for the second frame is adjusted based on the second plurality of noise suppression values. The filter (120; 310; 410; 820) is furthermore configured to filter the first frame of the audio signal with the first filter and to filter the second frame of the audio signal with the second filter.

Concluding, some embodiments of the present inventions can be summarized in a list. In an advantageous embodiment NR is applied first and comprises the following steps:

1. Receive an audio input signal.
2. Determine a noise attenuation limit based on an AGC gain determined in the previous time frame, a desired noise attenuation amount, and optionally based also on a distortion limit.
3. Determine a noise reduction filter based on the audio input signal and the noise attenuation limit.
4. Determine an AGC gain based on a target signal level, an optional voice activity information, and an audio signal
   a) the audio signal being the audio input signal, or
   b) the audio signal being a noise-reduced audio signal obtained by applying the noise reduction filter to the audio input signal, the optional voice activity information being used to optionally decrease the AGC gain during speech pauses.
5. Generate an output audio signal by applying the noise reduction filter and the AGC gain obtained in the previous frame to the audio input signal.

Furthermore, another advantageous embodiment according to the invention is characterized as applying AGC first is performed according to:

1. Receive an audio input signal.
2. Determine an AGC gain based on a target signal level, an optional voice activity information, and the audio input signal, the optional voice activity information being used to optionally decrease the AGC gain during speech pauses.
3. Determine a noise attenuation limit
   a) based on a desired noise attenuation amount and the current AGC gain, or
   b) based on a desired noise attenuation amount, a distortion limit, and the current AGC gain.
4. Determine a noise reduction filter based on the audio input signal and the noise attenuation limit.
5. Generate an output audio signal by applying the noise reduction filter and the current AGC gain to the audio input signal.

Although the present invention has been described in the context of block diagrams where the blocks represent actual or logical hardware components, the present invention can also be implemented by a computer-implemented method. In the latter case, the blocks represent corresponding method steps where these steps stand for the functionalities performed by corresponding logical or physical hardware blocks.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disc, a DVD, a Blu-Ray, a CD, a ROM, a PROM, and EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may, for example, be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive method is, therefore, a data carrier (or a non-transitory storage medium such as a digital storage medium, or a computer-readable medium) comprising, recorded thereon, the computer program for performing one of the methods described herein. The data carrier, the digital storage medium or the recorded medium are typically tangible and/or non-transitory.

A further embodiment of the invention method is, therefore, a data stream or a sequence of signals representing the computer program for performing one of the methods described herein. The data stream or the sequence of signals may, for example, be configured to be transferred via a data communication connection, for example, via the internet.

A further embodiment comprises a processing means, for example, a computer or a programmable logic device, configured to, or adapted to, perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example, a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

REFERENCES

[1] E. Hänsler and G. Schmidt: "Hands-free telephones—Joint Control of Echo Cancellation and Postfiltering", Signal Processing, Volume: 80, Issue: 11, pp. 2295-2305, September 2000.

[2] F. Kürch, E. Mabande and G. Enzner, "State-space architecture of the partitioned-block-based acoustic echo controller," in Proc. IEEE International Conference on Acoustics, Speech and Signal Processing (ICASSP), May 2014.

[3] A. Favrot, C. Faller, M. Kallinger, F. Kürch, and M. Schmidt, "Acoustic Echo Control Based on Temporal Fluctuations of Short-Time Spectra," in Proc. International Workshop on Acoustic Echo and Noise Control (IWAENC), September 2008.

[4] Y. Ephraim, D. Malah, "Speech enhancement using a minimum mean-square error short-time spectral amplitude estimator," IEEE Trans. Acoust. Speech Signal Process, Vol. 32, pp. 1109-1121, December 1984.

[5] Guangji Shi and Changxue Ma, "Subband Comfort Noise Insertion for an Acoustic Echo Suppressor," in Proc. 133rd Audio Engineering Society Convention, October 2012.

[6] M. Matsubara, K. Nomoto. "Audio signal processing device and noise suppression processing method in automatic gain control device." Patent publication No. US 2008/0147387 A1.

What is claimed is:

1. Apparatus for processing an audio signal, comprising:
an audio signal analyzer configured for analyzing an audio signal to determine a plurality of noise suppression filter values for a plurality of bands of the audio signal,
wherein the audio signal analyzer is configured to determine the noise suppression filter values so that a noise suppression filter value is greater than or equal to a minimum noise suppression filter value, and so that the minimum noise suppression filter value depends on a characteristic of the audio signal; and
a filter configured for filtering the audio signal, wherein the filter is adjusted based on the noise suppression filter values,
wherein the audio signal analyzer is configured to calculate a gain value from a frame of the audio signal as the characteristic of the audio signal, and wherein the audio signal analyzer is configured to calculate the minimum noise suppression filter value so that the minimum noise suppression filter value decreases with an increasing gain value.

2. Apparatus according to claim 1, wherein the audio signal analyzer is configured to determine the noise suppression filter values using a maximum decision based on a plurality of unconstrained noise suppression filter values and the minimum noise suppression filter value, the minimum noise suppression filter value being equal for the plurality of bands of the audio signal.

3. Apparatus according to claim 1, wherein the audio signal analyzer is configured to calculate the minimum noise suppression filter value based on a predetermined noise suppression filter value, and the gain value.

4. Apparatus according to claim 1, wherein the audio signal analyzer is configured to calculate the minimum noise suppression filter value using a minimum decision dependent on a predetermined noise suppression filter value and a quotient of a predetermined noise suppression filter value and the gain value.

5. Apparatus according to claim 1,
wherein the audio signal analyzer is configured
to analyze a band of the plurality of bands of the audio signal to determine, whether the band exhibits a first characteristic of the audio signal or a second characteristic of the audio signal, wherein the first characteristic of the audio signal is different from the second characteristic of the audio signal, and to determine the noise suppression filter values, when the second characteristic of the audio signal has been determined for the band, so that the noise suppression filter values are equal to a product of a predetermined noise suppression filter value and the gain value, when the gain value is between 0 and 1, or so that the noise suppression filter values are equal to the predetermined noise suppression filter value, when the gain value is between 1 and the product of the predetermined noise suppression filter value and a predetermined distortion limit, or so that the noise suppression filter values are equal to the quotient of the gain value and the predetermined distortion limit, when the gain value is between the product of the predetermined noise suppression filter value and the predetermined distortion limit, or so that the noise suppression filter values are equal to 1, when the gain value is greater than the predetermined distortion limit.

6. Apparatus according to claim 1,
wherein the audio signal analyzer is configured
to calculate, for a first frame of the audio signal, the gain value resulting in a first minimum noise suppression filter value,
to calculate, for a second frame of the audio signal, a second gain value resulting in a non-smoothed second minimum noise suppression filter value, wherein the second frame follows the first frame in time, and
to calculate a smoothed minimum noise suppression filter value for the second frame using the non-smoothed second minimum noise suppression filter value and the first minimum noise suppression filter value.

7. Apparatus according to claim 1, comprising:
a time-frequency converter providing a frequency-domain representation of the audio signal providing the plurality of bands of the audio signal, and
wherein the audio signal analyzer is configured to calculate a noise suppression filter value for a band of the plurality of bands of the audio signal based on one or more bands of the plurality of bands of the audio signal, and the minimum noise suppression filter value,
wherein the minimum noise suppression filter value is based on a predetermined noise suppression filter value which is equal for each band of the plurality of bands of the audio signal, or a predetermined distortion limit which is equal for a plurality of bands of the audio signal, and a value derived from the characteristic of the audio signal, the value being equal for each band of the plurality of bands of the audio signal.

8. Apparatus according to claim 1, wherein the audio signal analyzer is configured to calculate an amplitude information of the audio signal, and to calculate a gain value, as a characteristic of the audio signal, based on the amplitude information and a predetermined target value, to which the audio signal is adjusted to by means of the gain value.

9. Apparatus according to claim 1,
wherein the audio signal analyzer comprises a voice activity detection unit providing a first voice activity information of a first frame of the audio signal, and a second voice activity information of a second frame of the audio signal, and a memory unit to store a previous gain value, and wherein the audio signal analyzer is configured to:
estimate the gain value based on the second frame of the audio signal in which voice has been detected according to the second voice activity information, or
keep the gain value of the first frame if no voice activity has been detected in the second frame according to the second voice activity information, when voice has been detected in the first frame based on the first voice activity information,
wherein the second frame follows the first frame in time.

10. Apparatus according to claim 1,
wherein the audio signal analyzer is configured
to calculate the minimum noise suppression filter value for a current frame based on a value derived from the characteristic of the audio signal calculated for a current frame, and
to analyze the audio signal for determining the value derived from the characteristic of the audio signal, and
wherein the filter comprises a first filter stage and a second filter stage, and wherein the first filter stage is adjusted using the value derived from the characteristic of the audio signal, and wherein the second filter stage is adjusted according to the noise suppression filter values.

11. Apparatus according to claim 1,
wherein the audio signal analyzer is configured to calculate the minimum noise suppression filter value for a second frame based on a value derived from the characteristic of the audio signal, calculated for a first frame, and
wherein the filter comprises a first filter stage and a second filter stage, wherein the first filter stage is adjusted according to the noise suppression filter values, and wherein the second filter stage is adjusted using the value derived from the characteristic of the audio signal, and
wherein the audio signal analyzer is configured to analyze an output of the first filter stage for determining the value derived from the characteristic of the audio signal, wherein the second frame follows the first frame in time.

12. Apparatus according to claim 1, wherein the audio signal analyzer is configured
to determine the gain value based on a voice activity information and the audio signal, or
to determine a voice activity information and the audio signal after being filtered by the noise suppression filter values, and
to acquire the voice activity information based on the audio signal, or to acquire the voice activity information based on the audio signal after being filtered by the filter, or
so that a voice activity information indicating no speech present is used to decrease the gain value.

13. Apparatus according to claim 1,
wherein the audio signal analyzer is configured
to analyze the audio signal in a sequence of frames comprising a first frame and a second frame following the first frame in time,
to determine, for the first frame, a first plurality of noise suppression filter values, and to determine, for the second frame, a second plurality of noise suppression filter values,
to determine the first plurality of noise suppression filter values so that the noise suppression filter values of the first plurality of noise suppression filter values are greater than or equal to a first minimum noise suppression filter value determined for the first frame, and so that the first minimum noise suppression filter value depends on a first characteristic of the first frame of the audio signal, to determine the second plurality of noise suppression filter values so that the noise suppression filter values of the second plurality of noise suppression filter values are greater than or equal to a second minimum noise suppression filter value determined for the second frame, and so that the second minimum noise suppression filter value depends on a second characteristic of the second frame of the audio signal; and wherein the filter is configured for filtering the audio signal in the sequence of frames, wherein a first filter for the first frame is adjusted based on the first plurality of noise suppression filter values, and wherein a second filter for the second frame is adjusted based on the second plurality of noise suppression filter values, and to filter the first frame of the audio signal with the first filter and to filter the second frame of the audio signal with the second filter.

14. Method for processing an audio signal, comprising:

analyzing an audio signal to determine a plurality of noise suppression filter values for a plurality of bands of the audio signal, determining the noise suppression filter values so that a noise suppression filter value is greater than or equal to a minimum noise suppression filter value, and so that the minimum noise suppression filter value depends on a characteristic of the audio signal; and filtering the audio signal based on the noise suppression filter values, wherein the analyzing comprises calculating a gain value from a frame of the audio signal as the characteristic of the audio signal, and calculating the minimum noise suppression filter value so that the minimum noise suppression filter value decreases with an increasing gain value.

15. A non-transitory digital storage medium having a computer program stored thereon to perform, when said computer program is run by a computer, a method for processing an audio signal, said method comprising:

analyzing an audio signal to determine a plurality of noise suppression filter values for a plurality of bands of the audio signal, determining the noise suppression filter values so that a noise suppression filter value is greater than or equal to a minimum noise suppression filter value, and so that the minimum noise suppression filter value depends on a characteristic of the audio signal; and filtering the audio signal based on the noise suppression filter values, wherein the analyzing comprises calculating a gain value from a frame of the audio signal as the characteristic of the audio signal, and calculating the minimum noise suppression filter value so that the minimum noise suppression filter value decreases with an increasing gain value.

* * * * *